United States Patent [19]

Leone et al.

[11] Patent Number: 5,541,407
[45] Date of Patent: Jul. 30, 1996

[54] ARSENIC ATOM SOURCE

[75] Inventors: Stephen R. Leone; April L. Alstrin; Paul G. Strupp; Adina K. Kunz; Sean M. Casey, all of Boulder, Colo.; Russell V. Smilgys, Fairfax, Va.

[73] Assignee: The United States of America as represented by the Secretary of Commerce, Washington, D.C.

[21] Appl. No.: 403,066

[22] Filed: Mar. 13, 1995

Related U.S. Application Data

[63] Continuation-in-part of Ser. No. 19,854, Feb. 19, 1993, Pat. No. 5,397,895, which is a continuation-in-part of Ser. No. 950,602, Sep. 24, 1992, abandoned.

[51] Int. Cl.$^6$ ..................................................... H05H 3/02
[52] U.S. Cl. ........................................... 250/251; 118/726
[58] Field of Search ............................. 250/251; 118/726

[56]  References Cited

U.S. PATENT DOCUMENTS

| 4,392,453 | 7/1983 | Luscher | 118/726 |
| 5,248,631 | 9/1993 | Park et al. | 437/105 |

FOREIGN PATENT DOCUMENTS 2601261 1/1988 France .

OTHER PUBLICATIONS

Garcia, J. C. et al., "Dimer arsenic source using a high efficiency catalytic cracking oven for molecular beam epitaxy," App. Phys. Lett. (1987) 51(8):593–595.

Kruso, B. S. and Bachrach, R. Z., "Two–stage arsenic cracking source with integral getter pump for MBE growth," J. Vac. Sci. Technol. B (1983) 1(2):138–141.

Mattord, T. J. et al., "Baffle–free refractory dimer arsenic source for molecular–beam epitaxy," J. Vac. Sci. Technol. B. (1988) 6(6):1667–1670.

Panish, M. B., "Gas Source Molecular Beam Epitaxy of InP, GaInAs and GaInAsP," Prog. Crystal Growth and Charact. (1986) 12:1–28.

Kapitan, L. W. et al., "On the design and characterization of a novel arsine cracking furnace utilizing catalytic decomposition of $AsH_3$ to yield a purely monomeric source of arsenic for molecular beam epitaxial growth of GaAs," J. Vac. Sci. Technol. B (1984) 2(2):280–284.

Calawa, A. R., "On the use of $AsH_3$ in the molecular beam epitaxial growth of GaAs," Appl. Phys. Lett. (1981) 38(9):701–703.

Shiralagi, K. T. et al., "Hydride cracker nozzle design for gas source molecular beam epitaxy," J. Vac. Sci. Technol. A (1992) 10(1):46–50.

Lee et al., "Material effects on the cracking efficiency of molecular beam epitaxy arsenic cracking furnaces," J. Vac. Sci. Technol. B (1986) 4(2):568–570.

Huet, D. et al., "Molecular beam epitaxy of $In_{0.53}Ga_{0.47}As$ and InP on InP by using cracker cells and gas cells," J. Vac. Sci. Technol. B (1985) 3(3):823–829.

(List continued on next page.)

Primary Examiner—Jack I. Berman
Attorney, Agent, or Firm—Greenlee and Winner

[57]  ABSTRACT

The present invention provides a source of Group V and VI atoms, and in particular arsenic atoms, usable in MBE as a growth source or a doping source. The arsenic atoms are produced in two steps. In the first step, a sublimator vaporizes solid arsenic, producing a molecular beam of arsenic tetramers and/or dimers. The molecular beam source can optionally include a cracker to produce $As_2$ from $As_4$. In the second step, the molecular beam impinges on a surface of a heated element, termed an atomizer, producing an output beam containing atomic arsenic. The atomizer is at a temperature above about 1200K and a pressure below about $10^{-3}$ torr or at a temperature above about 1400K and a pressure below about $10^{-2}$ torr. For other Group V and VI elements, different atomizer temperatures and pressures are used. Materials which can be used for the atomizer include tungsten, lanthanum, niobium, rhenium, molybdenum, tantalum, stainless steel, nickel, carbon, platinum, boron, silicon, ceramics and boron nitride.

53 Claims, 8 Drawing Sheets

OTHER PUBLICATIONS

Alstrin, A. L. et al., "Direct detection of atomic arsenic desorption from Si(100)," Appl. Phys. Lett. (1993) 63(6):815–817.

Strupp, P. G. et al., "Single–photon laser ionization time–of–flight mass spectroscopy detection in molecular–beam epitaxy: application to $As_4$, $As_2$, and Ga," Applied Optics (1993) 32(6):842–846.

EPI 1993 Product Guide, Chorus Corporation, Saint Paul, MN, pp. 5–34.

Miles, R. H. et al., "Midwave infrared stimulated emission from a GaInSb/InAs superlattice," Appl. Phys. Lett. (1995) 66(15):1921–1923.

ARSENIC ATOM SOURCE

This application is a continuation-in-part of U.S. Ser. No. 08/019,854 filed Feb. 19, 1993, which is a Continuation-in-art of U.S. Ser. No. 07/950,602 filed Sep. 24, 1992, now abandoned, both of which are herein incorporated by reference in their entirety.

FIELD OF THE INVENTION

This invention pertains to a method and apparatus for producing atomic Group V and VI elements, and particularly atomic arsenic, suitable for use in molecular beam epitaxy.

BACKGROUND OF THE INVENTION

High quality semiconductors can be manufactured by molecular beam epitaxy (MBE) wherein atomic or molecular beams of the semiconductor constituents are directed at an epitaxial growth surface. Elements of importance in semiconductor devices include the members of Groups II, III, IV, V and VI of the periodic table. The most common sources of molecular beams for use in MBE are effusion ovens for sublimating solid elements. Most of the elements sublime as atoms but some, most notably elements of Groups V and VI, sublime as polymers, such as dimers, tetramers, or mixtures thereof. It is to the elements which sublime as molecules, and most particularly to arsenic, that the present invention relates.

For elements which sublime as molecules, the sublimator can be followed by a cracker, a second heated stage, which breaks the molecules into smaller molecules. The Group V elements, P, As and Sb, sublime as tetramers and are cracked into dimers. The Group VI elements S and Se sublime as polymers with n=2–8 atoms and are cracked into dimers. The Group V element Bi and the Group VI element Te sublime as dimers. In a typical two-stage cracking furnace for arsenic (see, for example, Lee et al., J. Vac. Sci. Technol. (1986) B4:568; Garcia et al., Appl. Phys. Lett. (1987) 51:593) the first stage is a metallic arsenic sublimator heated to about 600K, which produces a molecular beam consisting mainly of arsenic tetramers. The tetramer beam then enters the second stage, the cracker, which is at a temperature of about 800–1300K and a pressure of about 10 mtorr. The cracker walls are made of materials such as graphite, tantalum, boron nitride, molybdenum or rhenium. In the second stage the arsenic tetramers are cracked into dimers. The dimer yield increases with cracker temperature and depends on the cracker material.

A second type of molecular beam source starts with gaseous hydrides, as opposed to solid elements, and cracks the hydrides in a heated furnace. Arsenic molecular beam sources (see, for example, Calawa, Appl. Phys. Lett. (1981) 38:701 or Kapitan et al., J. Vac. Sci. Technol. (1984) B2:280) utilize $AsH_3$ and a cracking furnace heated to about 800–1300K. The furnace is typically quartz and can also comprise heated tantalum. The resulting molecular beam contains $H_2$, $As_4$, $As_2$, As and AsH and $AsH_3$. In some cases the primary constituents are $H_2$ and As. The purity of material grown in these cases suggests that atomic As may be the preferred specie for the growth of GaAs. A complication with methods using $AsH_3$ as starting material is that $AsH_3$ is a highly toxic gas, requiring special safety considerations. In addition, since these methods generate a high background of molecular hydrogen, high speed vacuum pumps are required.

SUMMARY OF THE INVENTION

The present invention provides a source of Group V and VI atoms, and in particular arsenic atoms, usable in MBE as a growth source or a doping source. In the description of the present invention, arsenic is used as a representative of Group V and VI elements. The arsenic atoms are produced in two steps. In the first step, a sublimator vaporizes solid arsenic, producing a molecular beam of arsenic tetramers and/or dimers. The molecular beam source can optionally include a cracker to produce $As_2$ from $As_4$. In the second step, the molecular beam impinges on a surface of a heated element, termed an atomizer, producing an output beam containing atomic arsenic. The atomizer can be operated in two ranges of conditions having either (1) a temperature above about 1200K and a pressure below about $10^{-3}$ torr or (2) a temperature above about 1400K and a pressure below about $10^{-2}$ torr. For other Group V and VI elements, different atomizer temperatures and pressures are used. Materials which can be used for the atomizer include refractory metals (such as tungsten, lanthanum, niobium, rhenium, molybdenum and tantalum), stainless steel, nickel, carbon, platinum, boron, silicon, ceramics and boron nitride.

Previously known arsenic molecular beam sources utilizing a sublimator and a cracker produce predominantly $As_4$ and $As_2$, with negligible atomic arsenic. Indeed, previous sources were designed to maximize dimer yield, apparently without considering the possibility of obtaining an atomic arsenic beam. It is important to note that $As_1^+$ ions shown in mass spectrographic analysis of previous arsenic molecular beam sources are attributed to fragmentation of $As_4$ or $As_2$ within the mass spectrometer by electron impact ionization. The discovery by the present inventors of arsenic atoms emitted from a high temperature silicon surface under bombardment by an arsenic molecular beam (see the parent application, U.S. Ser. No. 08/019,854; and Alstrin et al. (1993) Appl. Phys. Lett 63:815) was unexpected and contrary to the teachings of the art. This surprising result led to the development of the arsenic atom source of the present invention.

The yield of atomic arsenic from the present invention can exceed 75%. Atomic arsenic is advantageous in the fabrication of high purity GaAs. Single atoms can incorporate in the growing crystal with fewer defects than polymers. In addition, the sticking coefficient of monomers is greater than polymers. This can increase the growth rate and it eliminates the need for arsenic over-pressures. A further advantage of this invention is that the starting material, solid arsenic, is not as hazardous as gaseous $AsH_3$. Other Group V gaseous hydrides are also toxic. Eliminating the toxic gasses reduces the safety risk during production and reduces the associated costs. Yet another advantage of this invention is that molecular hydrogen, with the resulting demand on the vacuum pumps, is not produced.

BRIEF DESCRIPTION OF THE DRAWINGS

FIG. 2, comprising

FIG. 3, comprising

FIG. 4, comprising

DETAILED DESCRIPTION OF THE PREFERRED EMBODIMENTS

Figure 1:
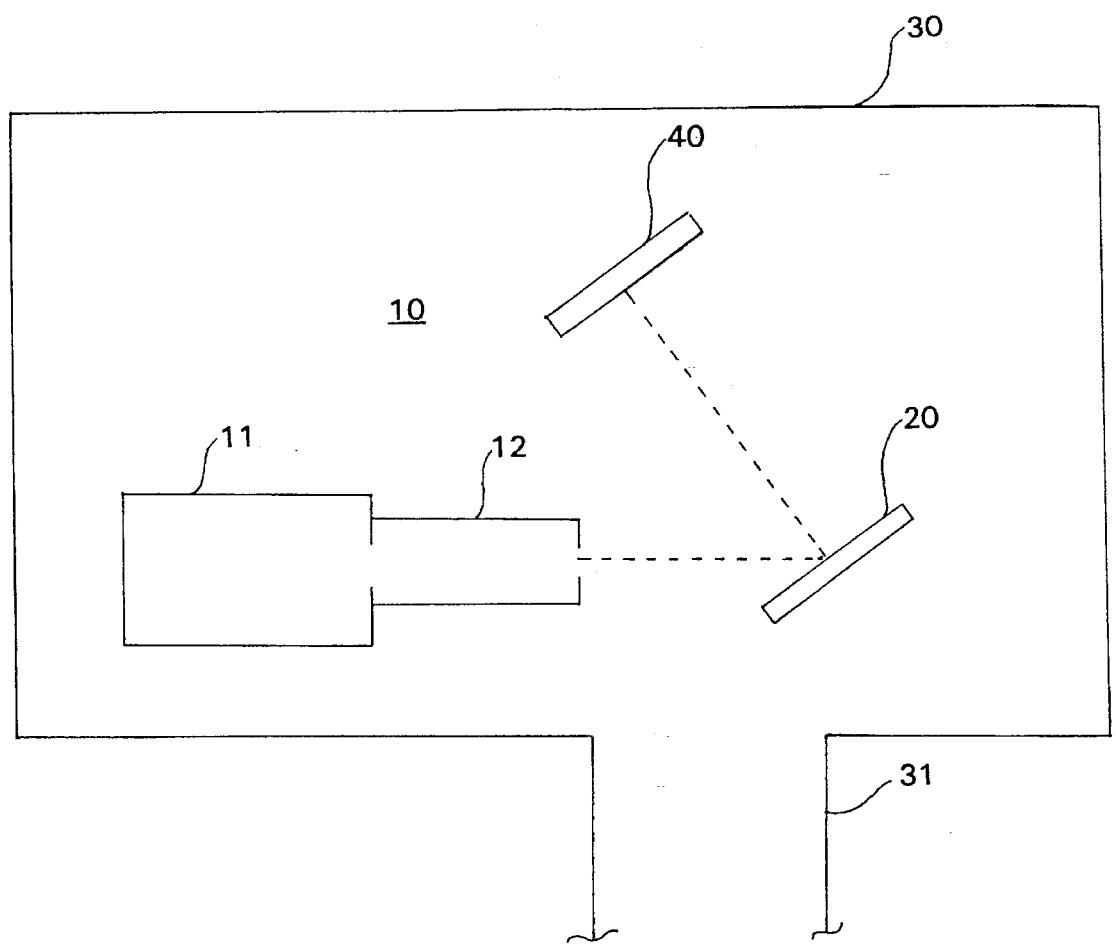
FIG. 1 shows a schematic of the arsenic atom source consisting of an arsenic molecular beam source followed by an atomizer.

FIG. 1 is an embodiment of the arsenic atom source of the present invention. The source comprises molecular beam source 10 which produces a beam of molecular arsenic consisting of tetramers and/or dimers, and atomizer 20 which intercepts the molecular beam and produces an output beam containing atomic arsenic. The beams are represented by dashed lines in the figure. The term molecular beam is used herein for a beam comprising gaseous molecular and/or atomic species. The term output beam is used herein to describe the beam which is reflected, desorbed, or otherwise emitted from the atomizer after the incident molecular beam impinges on the surface. The term atomizer is used herein for an element having a surface presented to the molecular beam which can be heated in vacuum. In this embodiment, the atom source is housed in ultra high vacuum (UHV) chamber 30, with connection 31 to vacuum pumps. Also shown in the figure is growth crystal 40, placed along the normal to atomizer 20. Alternatively, the source can be placed in a separate subchamber, with just the output beam entering the growth chamber.

Molecular beam source 10 comprises sublimator 11 for producing $As_4$, or $As_4$ and $As_2$, and can further include cracking furnace 12 to convert some or all of the $As_4$ to $As_2$. A sublimator is a vessel designed to contain a solid material and to heat the material. The sublimator is typically operated at a temperature of 550–650K, but it can be as low as 500K. In this temperature range the vapor pressure of arsenic is in the range of $5 \times 10^{-2}$– $5 \times 10^{-1}$ torr. For the other Group V and VI elements the sublimator temperature is adjusted to provide the desired vapor pressure. For arsenic, the temperature in the cracker is typically in the range of 1000–1100K and the pressure is typically $5$–$10 \times 10^{-2}$ torr. Many configurations of the sublimator and cracker can be employed, as are known in the art.

Atomizer 20 is made of a material which thermally or catalytically dissociates the molecular arsenic into atoms and emits arsenic atoms. For arsenic, the atomizer can be operated in two ranges of conditions having either (1) a temperature above about 1200K and a pressure below about $10^{-3}$ torr or (2) a temperature above about 1400K and a pressure below about $10^{-2}$ torr.

It is important to note that the pressure at the atomizer is the beam equivalent pressure due to the impinging molecular beam and is orders of magnitude higher than the chamber pressure, which is typically less than $10^{-7}$ torr. The beam equivalent pressure is not measured directly. It is calculated from the molecular beam flux, the beam temperature, and the source geometry. The molecular beam flux is measured from the crystal growth rate under conditions of unity sticking coefficient. The calculated pressure is accurate to within ±40%. When referring to the atomizer, the term pressure is used herein for the calculated pressure. The beam equivalent pressure can be measured, for example by removing the atomizer and positioning an ionization gauge in its place. However, the atomizer pressures reported herein are calculated beam equivalent pressures.

To minimize impurities in the output beam, the atomizer material preferably has a low vapor pressure at the operating temperature. The atomizer material also is preferably non-reactive with the molecular and atomic species at the operating temperature. Materials which can be used include refractory metals such as tungsten, lanthanum, niobium, rhenium, molybdenum and tantalum, as well as other metals and non-metals including stainless steel, nickel, carbon, platinum, boron, silicon, ceramics and boron nitride. Platinum may react with arsenic at temperatures above 800K. The atomizer can be made of a first material with a surface coating of a second material.

To produce pressures below $10^{-3}$ torr at the atomizer, there is preferably a means for providing a pressure differential between molecular beam source 10 and atomizer 20. This can be achieved with a beam flux limiting orifice at either the sublimator output or the cracker output. An adjustable orifice such as a needle valve can be placed between the sublimator and the cracker. Typically the small diameter of the sublimator or cracker relative to the vacuum chamber by itself leads to a reduced beam flux from the molecular beam source. The chamber geometry, such as the positioning of vacuum pumps and the design of heatshields can be engineered to increase the pumping speed or conductance, and thereby lower pressure, at the atomizer.

The distance from atomizer 20 to molecular beam source 10 is preferably small enough to maximize the amount of flux intercepted by the atomizer. The distance between the atomizer and growth crystal 40 is chosen to balance growth rate and uniformity. The closer the growth crystal to the atomizer, the higher the incident arsenic atom flux. However, too small a distance will give an uneven distribution of flux along the growth crystal surface. The angle atomizer 20 makes with the incoming molecular beam axis is chosen to intercept the incident molecular beam and to direct the output beam toward growth crystal 40. In the case where the atomic species is desorbed from the atomizer, the output beam follows a cosine distribution about the surface normal and the growth crystal is therefore positioned to intercept the normal.

The size of atomizer 20 is chosen large enough to intercept a large fraction of the incoming molecular beam and small enough that uniform heating can be accomplished. Methods of heating the atomizer include radiative heating, heating by electron impact from the rear, contact heating, and resistive heating. The temperature of the atomizer can be monitored, for example, by optical pyrometry or with a thermocouple.

An exemplary embodiment of the atom source used the following configuration. Atomizer 20 was a 1 cm×2 cm flat silicon wafer positioned 24 cm from molecular beam source 10, at an angle of 22° to the beam axis. The silicon was mounted on a 1.5 cm radius molybdenum ring and held in place with two tantalum clips. The silicon was radiatively heated and the temperature was measured by optical pyrometry.

Figure 2A:
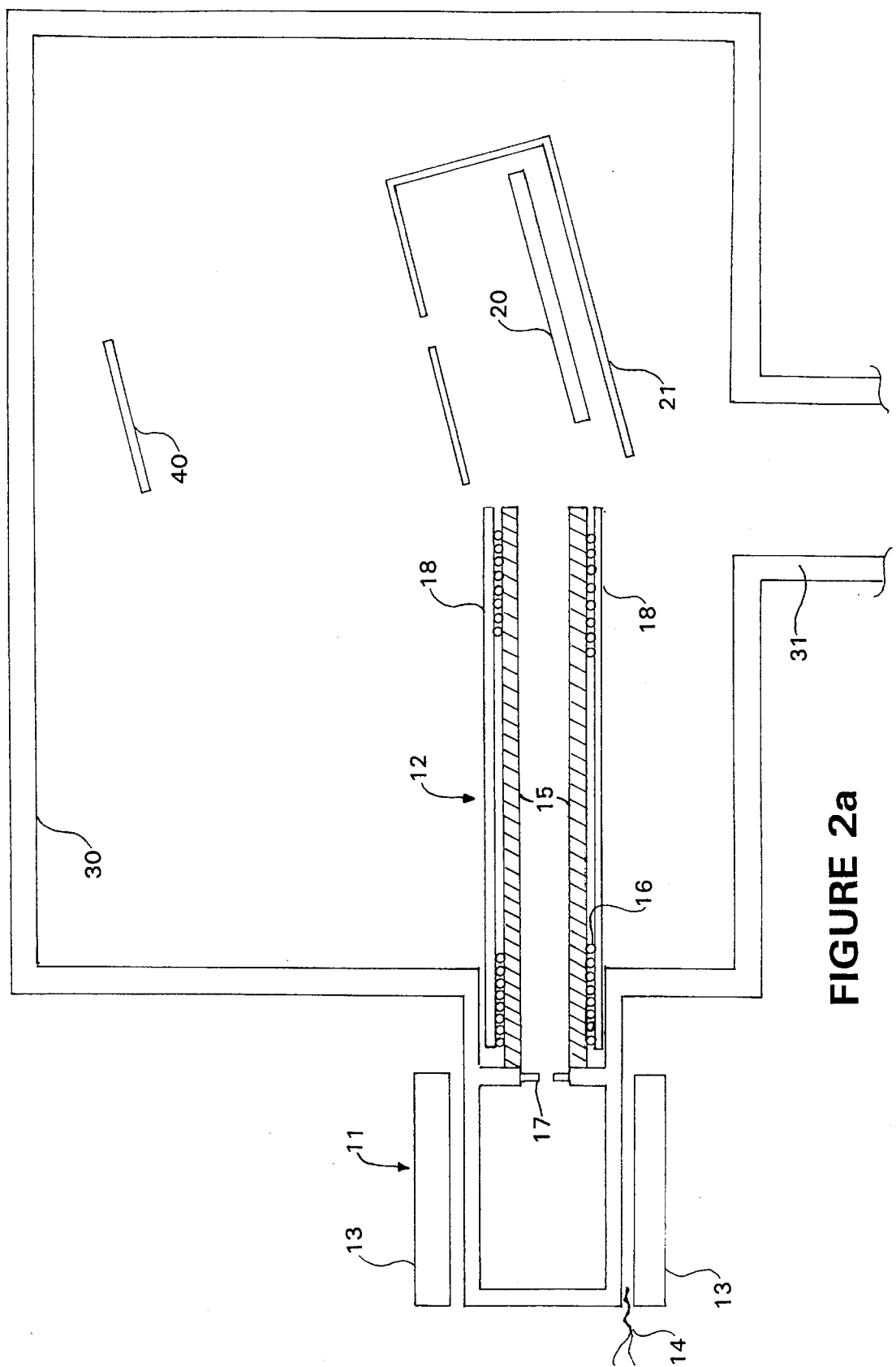
FIGS. 2a–c, shows three additional embodiments of the arsenic atom source. In (a) the atomizer is surrounded by a heat shield, in (b) the atomizer contains a plurality of heated plates, and in (c) the plate is cylindrically shaped.
Figure 2B:
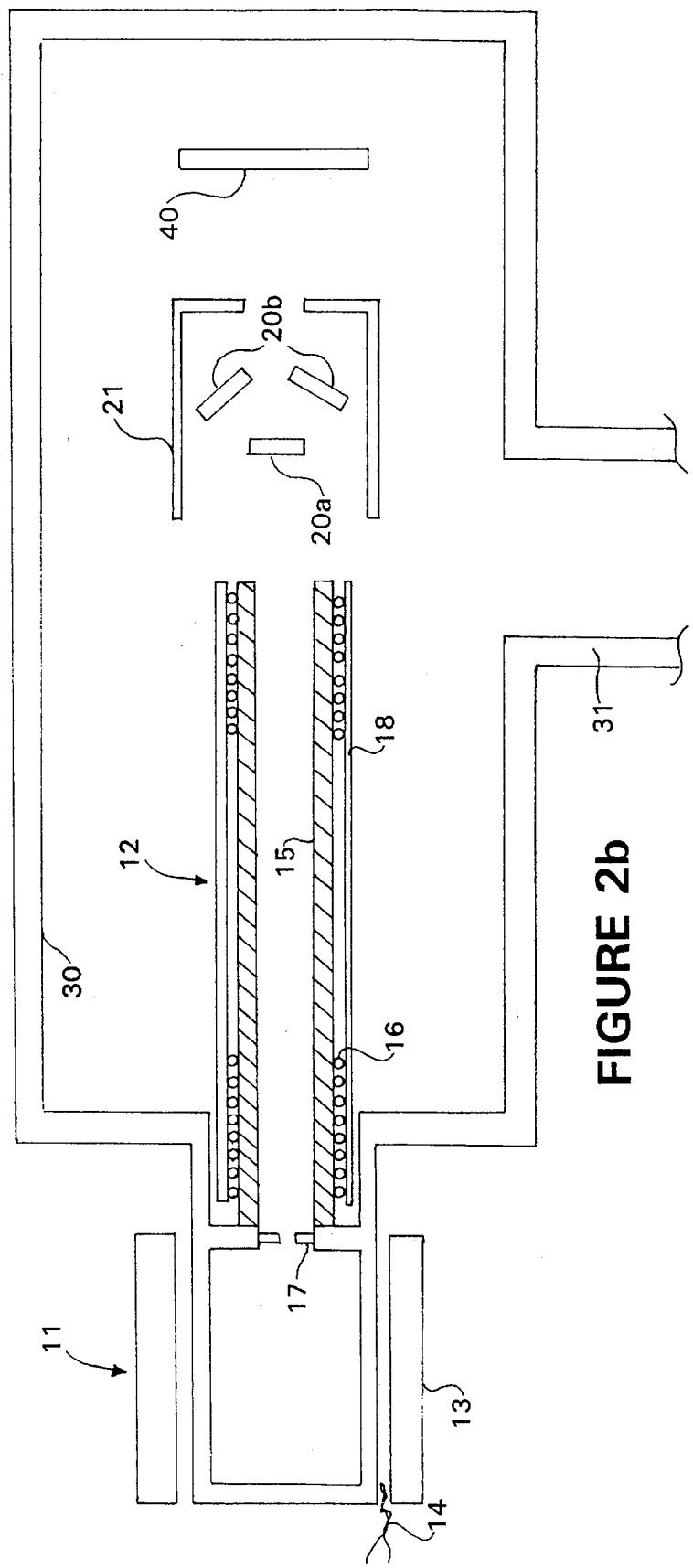
Figure 2C:
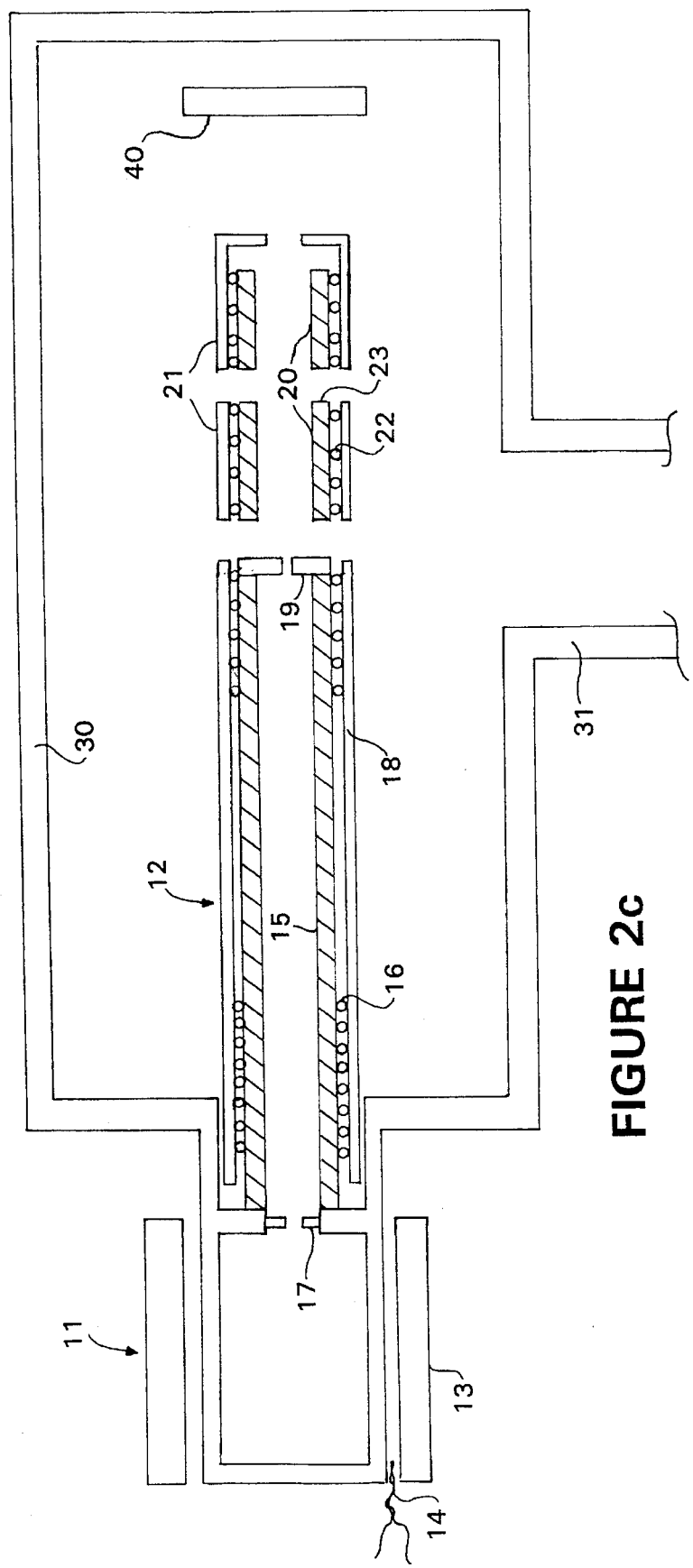

Further embodiments of the atom source are illustrated in FIGS. 2a–c. These drawings illustrate heating mantle 13 and thermocouple 14 within arsenic sublimator 11. Cracking stage 12 (optional) comprises molybdenum tube 15 surrounded by tungsten heater windings 16 and heat shield 18. Ceramic beads electrically isolate the heater wire from the molybdenum tube and the heat shield. Plate 17 (optional) with an orifice separates sublimator 11 from cracker 12. Atomizer 20 can be surrounded by heat shield 21.

The shape of atomizer 20 is chosen to receive the molecular beam and to direct the output beam toward growth crystal 40. The plate can be flat, as shown in FIG. 2a, or it can be shaped to direct more of the beam toward the growth surface. For example, it can have a concave shape to focus the emitted beam at the growth crystal. The term plate is used herein for material in any shape, not limited to flat.

The atomizer can contain a plurality of plates 20 as shown in FIG. 2b. The multiple atomizers can be arranged to increase the number of collisions of the molecular beam with the atomizer or to direct the output atoms towards the growth surface. In the embodiment of FIG. 2b the molecular beam can collide first with plates 20b, be output to plate 20a and be output from plate 20a toward growth surface 40.

The atomizer plate can also be cylindrically shaped as shown in FIG. 2c. In this embodiment atomizer 20 is heated with tungsten windings 22 and is surrounded by heat shield 21. The tungsten wire is electrically isolated using ceramic beads. The cylindrical atomizer can contain baffles or be bent to increase the number of collisions between molecular arsenic and the atomizer. In cases where the breaking of arsenic molecules into atoms is governed by thermodynamics, increased collisions with the atomizer can increase the temperature of the molecular beam and thereby increase the atom yield. In cases where the atomizing is catalytically enhanced, geometries, such as a flat plate, providing a single encounter with the atomizer may be preferred.

Numerous other atomizer geometries fall within the scope of this invention. The atomizer can, for example, be an angled plate or it can comprise a cylindrical plate in combination with a flat plate. The molecular beam can impinge simultaneously or sequentially on multiple plates. The surface of the atomizer can be a single crystal or it can be a rougher surface such as a metal foil surface. The surface can be intentionally roughened or grooved.

In FIGS. 2a–c plate 19 (optional) with an orifice separates cracker 12 from atomizer 20. The orifice functions to reduce the pressure at the atomizer compared to the cracker. In FIG. 2c the gap between the molecular beam source and the cylindrical atomizer also functions to allow vacuum pumping, via connection 31, to reduce the pressure at the atomizer. Alternative conductance pathways such as holes 23 or slits in the cylindrical atomizer and heat shield can be employed to allow pumping of the atomizer. The connection 31 to vacuum pumps can be strategically positioned to increase the pumping speed at the atomizer. To obtain reduced pressure at the atomizer, open plate atomizer geometries as in FIGS. 2a–b are preferred to the cylindrical atomizer shape of FIG. 2c because of the higher conductance for vacuum pumping.

Parameters relevant to optimization of the monomer yield are the pressure and temperature at atomizer 20. Thermodynamically, the monomer species is favored at higher temperatures since energy is needed for dissociation of the tetramers and dimers, and at lower pressures since at higher pressures the atoms tend to recombine into molecules. In traditional cracking furnaces, as the temperature is increased, favoring the monomer, the pressure also increases, favoring dimers and tetramers. These two effects tend to cancel each other resulting in very low monomer yields. For example, the cracker stage of a cracking furnace source has a typical temperature of 950K and a typical pressure of 10 mtorr. At this pressure and temperature, the thermodynamic equilibrium concentration of monomer is less than a tenth of a percent (see Table 1). One aspect of the enhanced monomer production in the atom source of this invention is the reduced pressure at the atomizer compared to the molecular beam source.

Table 1 shows the relationship between temperature and pressure at the atomizer and thermodynamic equilibrium arsenic atom yield, and can be used as a guide in operating the atom source of this invention. The table was generated by the following calculations. The major dissociation pathways and corresponding equilibrium constants are:

$$\text{reaction (1):} As_4 \rightarrow 2 As_2 \quad K_1 = \frac{P_{As_2}^2}{\text{Fact } P_{As_4}}$$

$$\text{reaction (2):} As_4 \rightarrow As_3 + As \quad K_2 = \frac{P_{As_3} P_{As}}{\text{Fact } P_{As_4}}$$

$$\text{reaction (3):} As_3 \rightarrow As_2 + As \quad K_3 = \frac{P_{As_2} P_{As}}{\text{Fact } P_{As_3}}$$

$$\text{reaction (4):} As_2 \rightarrow 2As \quad K_4 = \frac{P_{As}^2}{\text{Fact } P_{As_2}}$$

where $$P_{TOT} = P_{As_4} + P_{As_3} + P_{As_2} + P_{As}.$$

For pressures given in torr, Fact=750.1 torr/bar, since the thermodynamic reference state is given as 1 bar.

To evaluate the equilibrium constants, the standard Gibbs free energies, $\Delta G_i$, for each reaction are needed and can be obtained for temperatures up to 1200K from *Thermochemical Data of Pure Substances*, I. Barin et al., VCH, Weinheim, Germany, 2nd Ed. 1993. Values for $\Delta G_i$ and the resulting equilibrium constants are given in Table 2. Since a plot of $\Delta G$ vs. T is a straight line, $\Delta G$'s for higher temperatures can be estimated by linear extrapolation. The fit to $$\Delta G_i = mt + b$$

using the data of Table 2 is

|   | $\Delta G_1$ | $\Delta G_2$ | $\Delta G_3$ | $\Delta G_4$ |
|---|---|---|---|---|
| m | −0.1474 | −0.1580 | −0.1015 | −0.1122 |
| b | 285.9 | 410.3 | 259.9 | 384.4 |
| r | −0.99995 | −0.99999 | −0.99997 | −0.99997 | where r is the correlation coefficient.

Rearranging the above equilibrium expressions gives $$P_{As4} = P_{As}^4/(K_1 K_4^2 \text{Fact}^3)$$

$$P_{As3} = P_{As}^3/(K_3 K_4 \text{Fact}^2 0$$

$$P_{As2} = P_{As}^2/(K_4 \text{Fact}).$$

Therefore $$P_{TOT} = P_{As} + P_{As}^2/(K_4 \text{Fact}) + P_{As}^3/(K_3 K_4 \text{Fact}^2) + P_{As}^4/(K_1 K_4^2 \text{Fact}^3)$$

At T=1200K, for example, $$P_{TOT} = P_{As} + 9.92E+07 \ P_{As}^2 + 1.36E+11 \ P_{As}^3 + 7.30E+17 \ P_{As}^4.$$

At a particular temperature and total pressure, the partial pressures of monomer, dimer and tetramer can be calculated and are given in Table 1. The table shows that a high atomizer temperature and a low pressure both enhance the percent monomer in the output beam. For example, at a pressure of $10^{-2}$ torr, an atomizer temperature of 1600K is required to produce 10% arsenic monomer. However, at a pressure of $10^{-6}$ torr, 10% As atom yield can be achieved at an atomizer temperature of only 1200K. For arsenic atom production, preferred operating ranges are temperatures above 1200K and pressures below $10^{-3}$ torr or temperatures above 1400K and pressures below $10^{-2}$ torr. A more preferred operating range of operating parameters for the atomizer is temperatures between 1200 and 1800K and pressures less than or equal to about $10^{-3}$ torr. The lower pressure is preferred because it allows atom production at a lower temperature. Still lower pressures, $<10^4$ torr, are preferred when the atom source is used for doping the growth crystal. When high growth rates are desired, a preferred operating range is at temperatures above 1600K and pressures below $10^{-2}$ torr.

The monomer flux at the growth surface is proportional to both the flux of molecular arsenic impinging on the atomizer and the percent yield of atomic arsenic from the atomizer. The flux of molecular arsenic impinging on the atomizer depends on the sublimator temperature and geometric factors. The atomic arsenic yield depends on the temperature and pressure at the atomizer. As the sublimator temperature increases, the molecular beam flux at the atomizer increases. However, the pressure at the atomizer consequently increases, which decreases the percent atomic arsenic yield. Thus, depending on the exact operating conditions, for a fixed atomizer temperature increasing the molecular beam flux can either increase or decrease the arsenic atom flux at the growth surface.

Note that the results of these thermodynamic calculations give a minimum yield for a particular temperature and pressure. Any catalytic contributions to the mechanism increase the yield for a given temperature and pressure. The term catalytic is used herein for any mechanism that enhances the dissociation of molecules into atoms and/or the emission of these atoms into the gas phase. This includes chemisorption followed by desorption, as opposed to specular reflection. In the case of chemisorption, there could be increased heat transfer or there could be a lowering of the kinetic barrier to decomposition. For atomizer materials for which the process is catalytic the operating temperature can be lower than for a non-catalytic material, thereby reducing contamination by surface vaporization and outgassing.

This invention can be used for an atomic source of any element which sublimes as a molecular species and whose bond strength is less than or equal to about 5 eV. In lieu of a pure element, chemical compounds in the solid state can be used as the starting material in the atom source of this invention. For example, GaAs can be placed in the sublimator. Tables 3-9 show thermodynamically calculated atom yields for Group V members N, P, Sb and Bi and Group VI members S, Se and Te. These calculations show the atomizer temperature and pressure required to obtain monomers of each species. A yield >50% can be obtained with a temperature below 2000K and pressures below $10^{-2}$ torr for Sb, Bi, S, Se and Te. At pressures below $10^4$ torr, >50% P atoms are obtained at a temperature below 2000K. A catalytic effect would be required to significantly atomize N.

As shown by Tables 4–9, preferred operating ranges for the atomizer of this invention without a catalytic effect include the following. For P, pressure $<10^{-3}$ torr and temperature $>2000$K or pressure $<10^{-5}$ torr and temperature $>1800$K. For Sb, pressure $<10^{-2}$ torr and temperature $>1400$K or pressure $<10^4$ torr and temperature $>1200$K. For S, pressure $<10^{-2}$ torr and temperature $>2000$K or pressure $<10^4$ torr and temperature $>1700$K. For Se, pressure $<10^{-2}$ torr and temperature $>1600$K or pressure $<10^4$ torr and temperature $>1300$K. For Te, pressure $<10^{-2}$ torr and temperature $>1300$K or a pressure $<10^4$ torr and a temperature $>1100$K. The trade-off between pressures and temperature in choosing the operating range is shown in more detail in the tables. For atomizer materials which do provide a catalytic effect, the temperature can be lower and the pressure higher.

These calculations predict that atom formation in bismuth occurs at a relatively low temperature and high pressure. According to Table 6, the monomer yield is expected to exceed 50% at a temperature of 1000K and a pressure of $10^{-2}$ torr. These conditions are within the operating range of the crackers known in the art. Therefore, while the atom source of this invention can be used to prepare Bi monomers, it is not needed. Atoms of the other Group V and VI elements cannot be prepared in more than minute quantities (<1%) in standard crackers.

The following examples illustrate this invention but are not intended to limit the scope thereof.

EXAMPLE 1

The arsenic atom source of this invention was demonstrated and was compared with a molecular beam source. The fluxes of beam constituents were measured by photo-ionization time-of-flight mass spectrometry as described in detail in U.S. Pat. No. 5,347,895 and in Strupp et al., Appl. Opt. (1993) 32:842. Note that photo-ionization, in contrast with electron impact ionization, does not produce $As_1^+$ ion by fragmentation of arsenic polymer. Consequently, any signal at mass 75 is attributed to ionized arsenic atom.

Figure 3A:
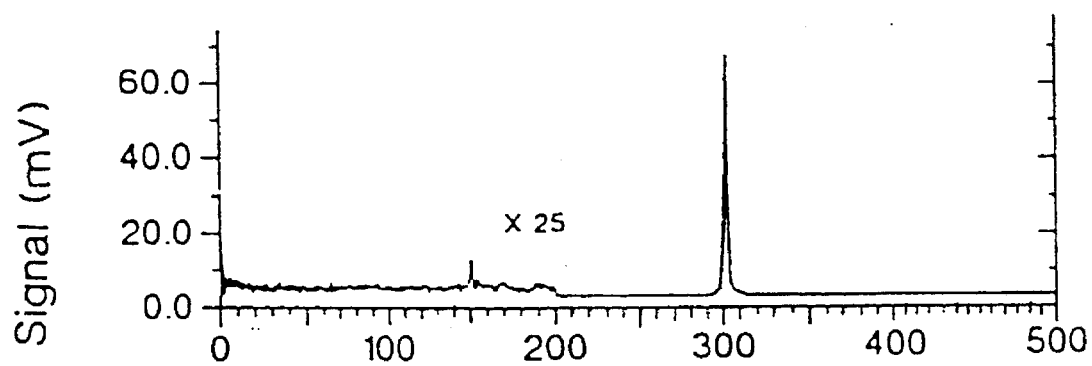
FIGS. 3a–b, shows mass spectra of arsenic molecular beams output from a sublimator heated to 580K in combination with a cracker at a temperature (a) <800K and (b) >1000K.
Figure 3B:
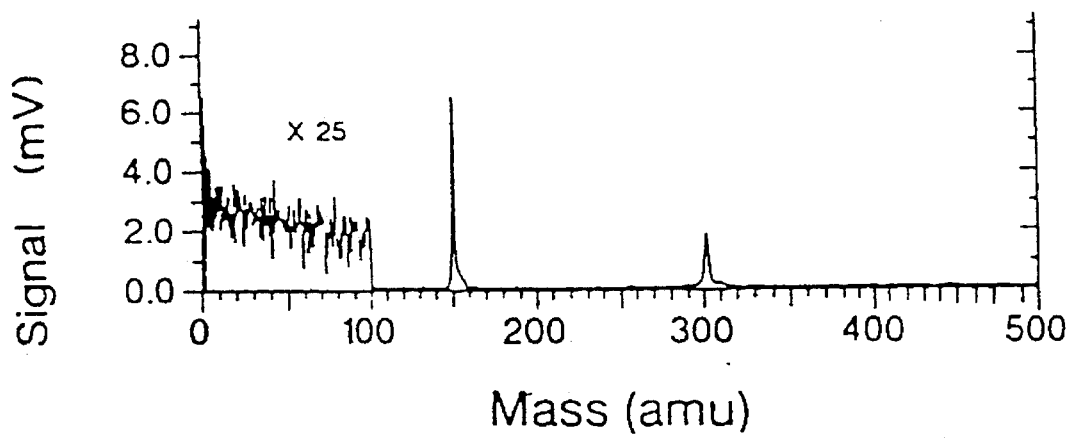

FIG. 3 shows mass spectra of arsenic molecular beams produced by a sublimator (FIG. 3a) and by a sublimator in combination with a cracker (FIG. 3b). A standard commercial cracker with a molybdenum cracker tube was used. In FIG. 3a the sublimator was operated at 580K, which produces an $As_4$ flux of the order of $10^4$ molecules cm$^{-2}$ s$^{-1}$, and the cracker temperature was below 800K, which is insufficient to crack $As_4$. The $As_4$ signal at mass 300 dominates the spectrum. A small signal at mass 150 ($As_2^+$) is observed which is attributed to laser-induced dissociation of $As_4$. When the cracker was heated to above 1000 K (FIG. 3b), $As_2$ was produced by thermal dissociation. At mass 75 no signal was observed, indicating that no atomic arsenic is produced and, additionally, confirming that no $As^+$ is produced by photo-fragmentation.

Figure 4A:
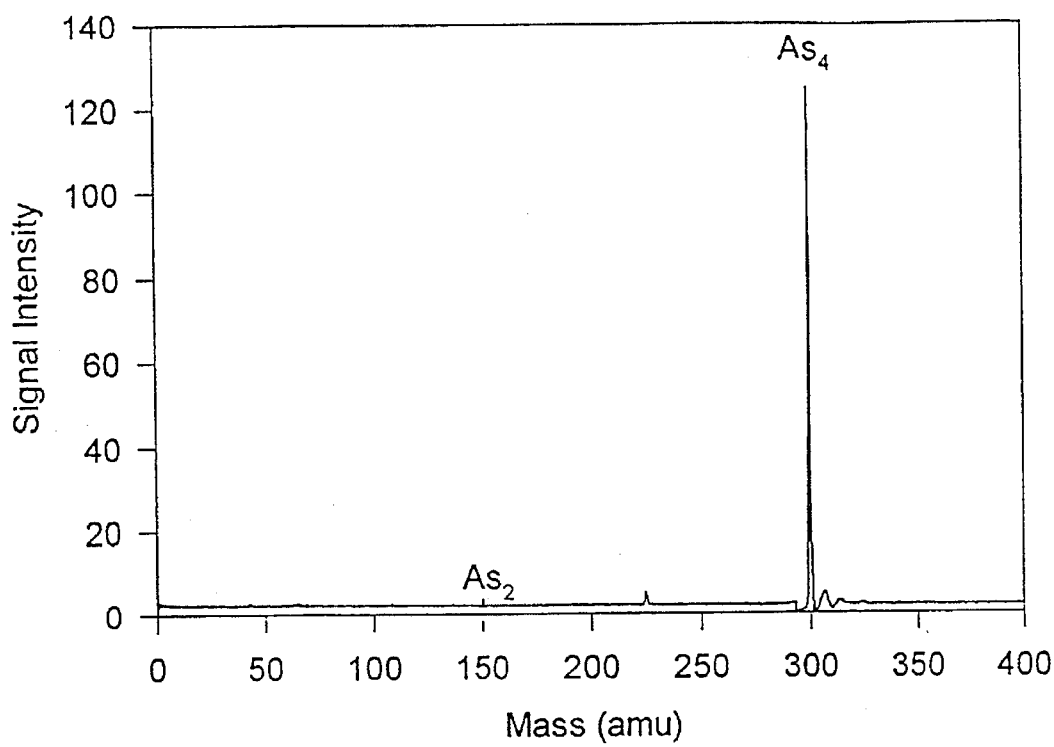
FIGS. 4a–b, shows mass spectra of arsenic molecular beams output from the atomizer of this invention heated to (a) 650K and (b) 1250K. The atomizer is tantalum and the pressure is approximately $7 \times 10^{-6}$ torr.
Figure 4B:
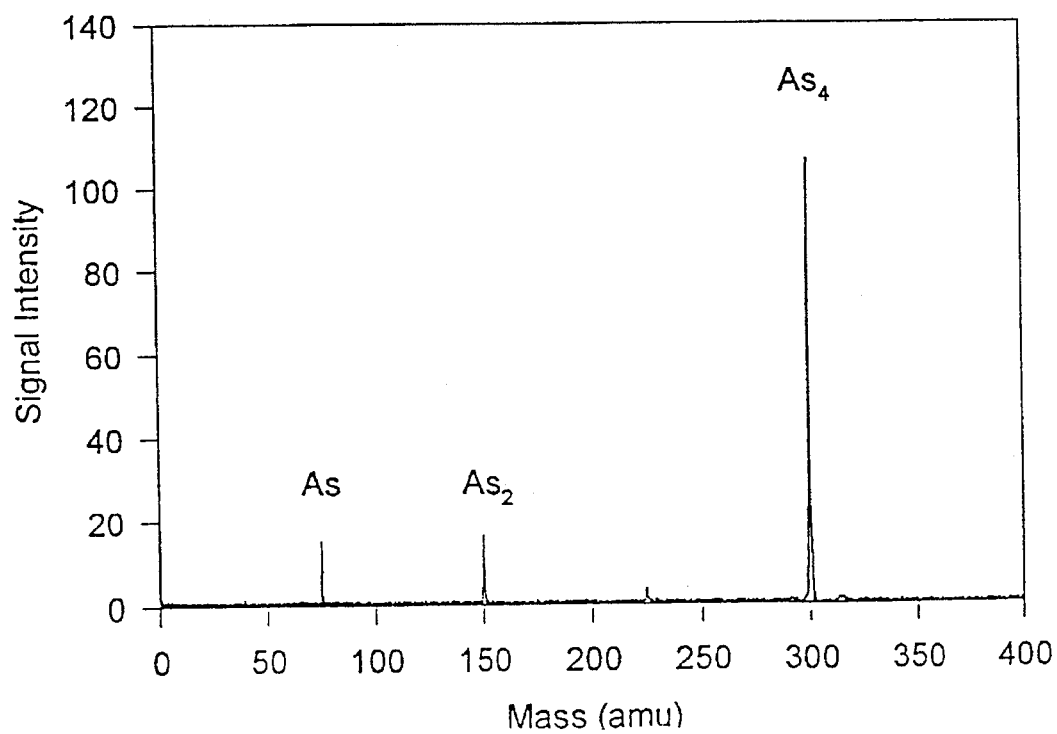

The commercial sublimator and cracker (FIG. 3) are compared to the sublimator and atomizer of this invention (FIG. 4). FIG. 4a shows the mass spectrum of a molecular beam produced by a sublimator operated at 630K. No cracker stage was used and the atomizer temperature was 650K, which is below the temperature required to produce atoms. The spectrum is dominated by the molecular beam $As_4$ signal at mass 300. A small $As_3^+$ ion signal is present at mass 225 due to fragmentation of $As_4$ by the ionizer. At mass 75, that of atomic arsenic, no signal is discernible. From the noise level, the signal intensity at mass 75 is estimated to be less than 0.5%. In FIG. 4b, the atomizer was heated to 1250K, within the temperature range for atom production. The atomizer was made of tantalum. The pressure at the atomizer was approximately $7 \times 10^{-6}$ torr. The temperature is known within ±30% and the calculated pressure is known to within ±40%. With the atomizer at this temperature, signals at mass 150 due to $As_2$ and at mass 75 due to atomic arsenic are present. At this temperature the large $As_4$ signal is attributed exclusively to the impinging molecular beam as opposed to the beam output from the atomizer. In this mass spectrum the yields have been corrected for the relative ionization cross sections of each species. Thermodynamically, based on Table 1, the As atom yield is predicted to be only one sixth the $As_2$ yield. In this measurement the atom yield equals the dimer yield, suggesting a catalytic enhancement of the atom production.

EXAMPLE 2

Figure 5:
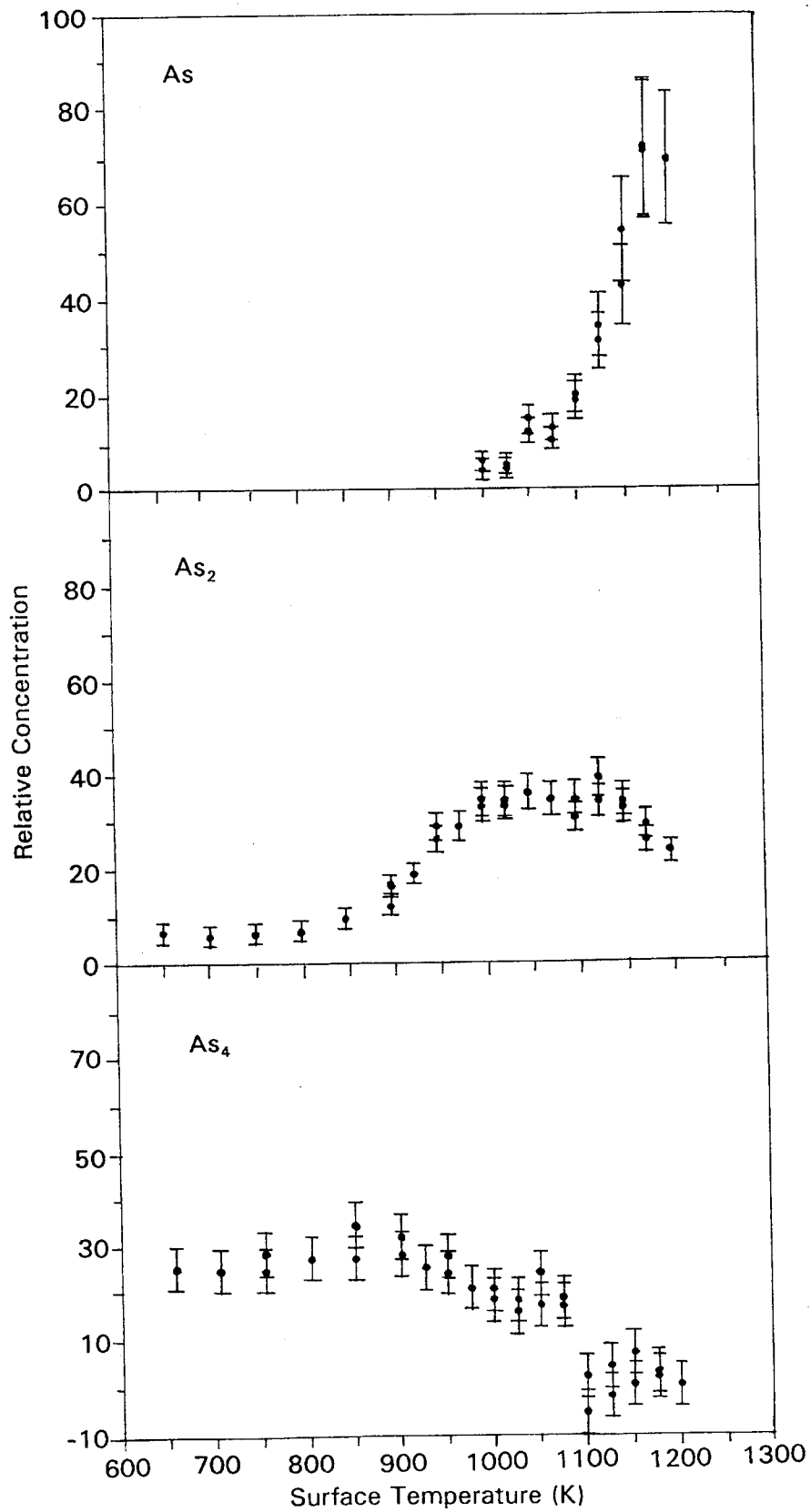
FIG. 5 shows the relative concentrations of arsenic species in the output beam as a function of atomizer temperature. The atomizer material is silicon and the pressure is approximately $5 \times 10^{-7}$ torr.

The constituents of the output beam as a function of the temperature of the atomizer are shown in FIG. 5. In this embodiment, the molecular beam source comprised a sublimator heated to 580K, which corresponds to a vapor pressure of $5\times10^{-2}$ torr. No cracker stage was used. The atomizer was a resistively heated silicon wafer with the (100) face receiving the molecular beam. The $As_4$ molecular beam flux at the silicon wafer was approximately $1\times10^{14}$ $cm^{-2}s^{-1}$, and the pressure at the silicon wafer was approximately $5\times10^{-7}$ torr.

Photoionization mass spectra were measured for silicon temperatures from 650 to 1200K. In order to convert the mass spectrum signal intensities to species concentration, the signals were corrected both for the different velocities of the arsenic species' and for the different species sensitivities to ionization. The overall conversion factors used were $As:As_2= 1:3.0\pm0.6$ and $As_2:As_4=1:4.0\pm0.9$. The $As:As_2$ conversion factor was obtained by depositing 1 monolayer (ML) of As on a silicon surface and measuring the As and $As_2$ signal intensity upon desorption at various temperatures. At lower temperatures mainly dimers desorb while at higher temperatures mainly monomers desorb. The $As_2:As_4$ conversion factor was determined by measuring the relative signals using a cracker at different temperatures. At lower temperatures the beam is mainly tetramer while at higher temperatures it is mainly dimer.

The conversion factors depend on both the measurement configuration and the operating parameters of the system. The internal energy of the molecules is a function of sublimator temperature and so different conversion factors are used for different sublimator temperatures. Changes in measurement configuration such as laser focussing position, ion lensing, or beam source geometry also change the conversion factors.

In measuring the beam flux produced by the source in this example, the arsenic tetramer signal was due to species in both the molecular beam impinging on the atomizer and the output beam. To correct for this, the experiment was repeated with the atomizer removed from the region to obtain the tetramer signal from the pure impinging beam. This signal was then subtracted from the total tetramer signal obtained with the atomizer in place.

The resulting relative gas phase concentrations of arsenic tetramer, dimer and atom in the output beam are shown in FIG. 5 as a function of the atomizer temperature. The data show that the dissociation of arsenic tetramer to dimer and atom depends strongly on the atomizer temperature. Atom production is substantial at temperatures greater than 1100K. For example, at 1200K, 75±19% of the output beam consists of monomer. This is approximately a factor of two greater than the thermodynamically predicted yield of Table 1, suggesting a catalytic enhancement by the silicon surface.

EXAMPLE 3

Figure 6:
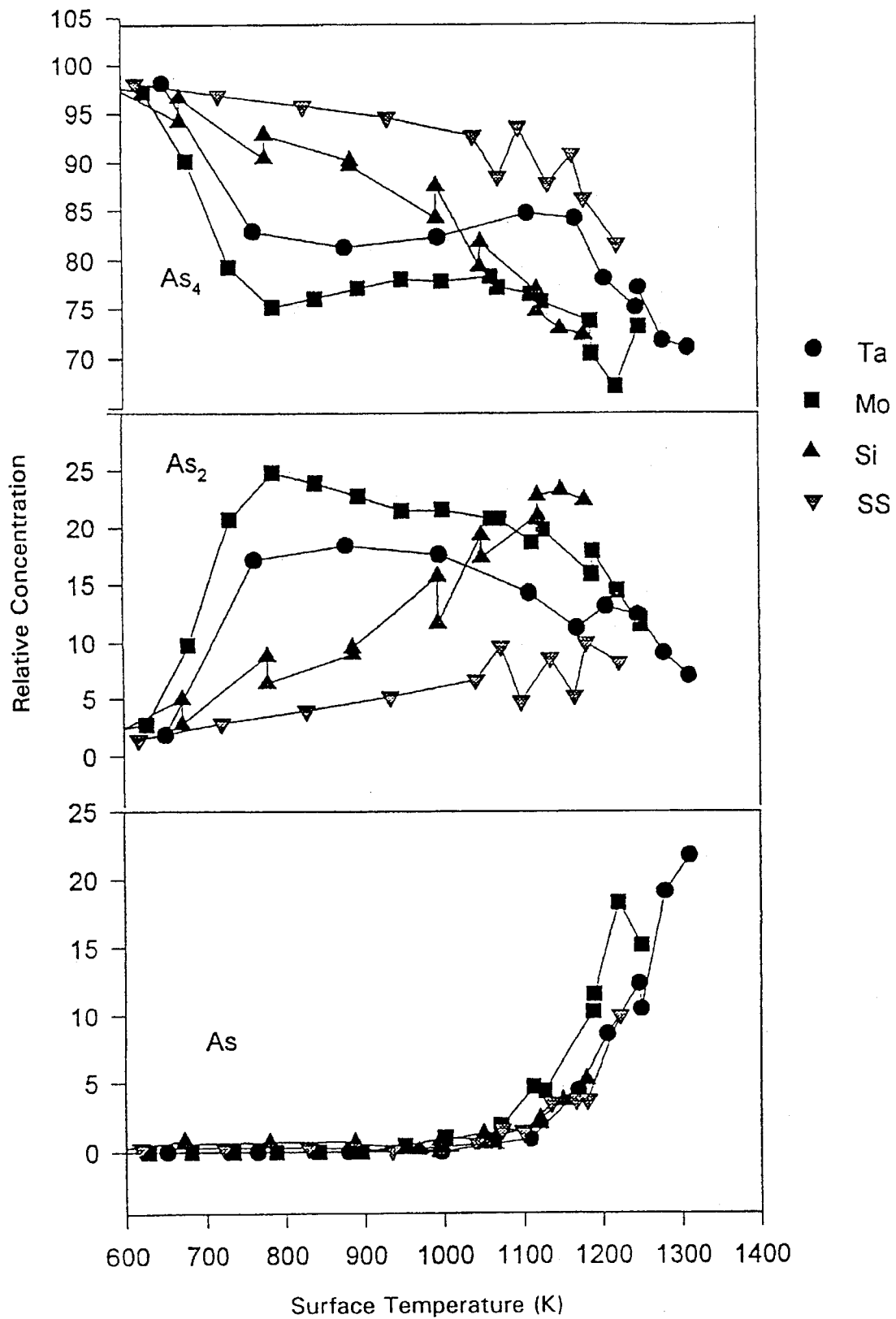
FIG. 6 shows the relative concentrations of arsenic species in the output beam as a function of atomizer temperature for four different atomizer materials: silicon, molybdenum, stainless steel, and tantalum. The pressure at the atomizer is $6 \times 10^{-6}$ torr.

The fluxes of output beam species were measured as a function of both atomizer material and temperature, as shown in FIG. 6. These measurements compare silicon, molybdenum, tantalum and stainless steel atomizers. The silicon was a (100) crystal and the molybdenum and tantalum were foils. The molecular beam source of this embodiment comprised a sublimator operated at 630 K, which corresponds to a vapor pressure of $2\times10^{-1}$ torr. This produced an $As_4$ flux of $2.5\times10^{-5}$ $cm^{-2}s^{-1}$ at the atomizer. The pressure at the atomizer was approximately $7\times10^{-6}$ torr. The atomizers were radiatively heated to temperatures from 600 to 1400K. Although there is uncertainty in absolute temperature of the atomizer, the relative temperatures of the four different atomizer materials are accurate.

The fluxes of arsenic tetramer, dimer and monomer above the atomizer were measured as a function of atomizer temperature (FIG. 6). In this embodiment the conversion factors were $As:As_2 =1:3.0\pm0.6$ and $As_2:As_4=1:1.7\pm0.1$. The data were not corrected to remove the flux of the $As_4$ molecular beam incident on the atomizer. FIG. 6 demonstrates the conversion of the incident $As_4$ molecular beam into $As_2$ as the atomizer is heated above 600 K and into atomic arsenic as the atomizer temperature increases above 1100K. The production of dimers is highly sensitive to the atomizer material utilized, indicating a catalytic effect. Molybdenum and tantalum produce $As_2$ at the lowest temperature, followed by silicon and stainless steel. Monomer production is less sensitive to atomizer material in this temperature range. Molybdenum has a greater monomer yield than the other materials. At temperatures beyond the range of this measurement, the dependence of the monomer yield on atomizer material may be greater.

Comparison of the arsenic atom yields of FIG. 6 with the thermodynamically predicted yields of Table 1 shows slightly more than a factor of two enhancement for molybdenum and slightly less than a factor of two enhancement for tantalum, silicon and stainless steel. Comparison of Examples 2 and 3 (FIGS. 5 and 6, respectively) illustrates the impact of the pressure at the atomizer on atom yield. Because the pressure at the atomizer was about an order of magnitude lower in Example 2, the atom yield at a given temperature is several times greater. This is consistent with the teachings of Table 1.

The desired growth rate for a semiconductor crystal is typically 1 ML/s. Assuming unity incorporation of As atoms into the growth surface, the required As atom flux is $10^{-5}$ atoms $cm^{-2}s^{-1}$. For a growth surface positioned 15 cm from the atomizer of Example 2, the flux at the growth surface is approximately $10^{-4}$ atoms $cm^{-2}s^{-1}$. This is more than sufficient for a dopant source which typically requires $10^{-2}$ to $10^{-6}$ ML/s.

To increase the molecular beam flux impinging on the growth surface, an increased molecular beam flux impinging on the atomizer is required. However, increasing the molecular beam flux also increases the pressure at the atomizer, which decreases the conversion efficiency to As atoms, as shown by Example 3. Thus both the flux of molecular arsenic reaching the atomizer and the temperature of the atomizer must be increased to increase the flux of arsenic atoms to the growth surface. Table 1 can be used as a guide to optimizing the parameters of molecular beam flux reaching the atomizer, pressure at the atomizer, and atomizer temperature. For a growth surface positioned 15 cm from the atomizer, a pressure at the atomizer of approximately $10^{-3}$ torr and an atomizer temperature of 1600K would produce an arsenic growth rate of about 1 ML/s.

This invention also includes other embodiments not shown in the above Examples which may increase the yield of atomic arsenic. Utilizing a cracker stage in the molecular beam source so that $As_2$ impinges on the atomizer instead of or in addition to $As_4$ may increase monomer yield. Other materials for the atomizer may be advantageous. In particular, rhenium, niobium and tungsten have desirable low vapor pressures at high temperature.

The atom source of the present invention is described and specific embodiments exemplified herein. Modifications and applications of this invention will be readily apparent to those skilled in the art and fall within the range and scope of this invention.

TABLE 1-continued

| Temp | $P_{TOT}$(Torr) | % As | % $As_2$ | % $As_3$ | % $As_4$ |
|---|---|---|---|---|---|
| 2200 K. | 1 | 46.5 | 53.2 | 0.2 | <0.1 |
| | $10^{-2}$ | 97.7 | 2.3 | <0.1 | <0.1 |
| | $10^{-4}$ | >99.9 | <0.1 | <0.1 | <0.1 |
| | $10^{-6}$ | >99.9 | <0.1 | <0.1 | <0.1 |
| | $10^{-8}$ | >99.9 | <0.1 | <0.1 | <0.1 |
| 2400 K. | 1 | 75.6 | 24.4 | 0.1 | <0.1 |
| | $10^{-2}$ | 99.6 | 0.4 | <0.1 | <0.1 |
| | $10^{-4}$ | >99.9 | <0.1 | <0.1 | <0.1 |
| | $10^{-6}$ | >99.9 | <0.1 | <0.1 | <0.1 |
| | $10^{-8}$ | >99.9 | <0.1 | <0.1 | <0.1 |

TABLE 2

| T | $\Delta G_1$ | $K_1$ | $\Delta G_2$ | $K_2$ | $\Delta G_3$ | $K_3$ | $\Delta G_4$ | $K_4$ |
|---|---|---|---|---|---|---|---|---|
| 300 | 242.4 | 6.24E-43 | 362.8 | 6.79E-64 | 229.9 | 9.36E-41 | 350.2 | 1.06E-61 |
| 400 | 227.1 | 2.21E-30 | 347.0 | 4.86E-46 | 219.4 | 2.24E-29 | 339.4 | 4.78E-45 |
| 500 | 212.0 | 7.13E-23 | 331.3 | 2.45E-35 | 209.1 | 1.43E-22 | 328.4 | 4.93E-35 |
| 600 | 197.0 | 7.08E-18 | 315.5 | 3.42E-28 | 198.8 | 4.93E-18 | 317.3 | 2.38E-28 |
| 700 | 182.2 | 2.54E-14 | 299.7 | 4.33E-23 | 188.6 | 8.45E-15 | 306.1 | 1.44E-23 |
| 800 | 167.5 | 1.16E-11 | 283.9 | 2.91E-19 | 178.5 | 2.21E-12 | 294.9 | 5.56E-20 |
| 900 | 152.9 | 1.34E-09 | 268.0 | 2.79E-16 | 168.4 | 1.68E-10 | 283.6 | 3.47E-17 |
| 1000 | 138.4 | 5.90E-08 | 252.2 | 6.71E-14 | 158.4 | 5.32E-09 | 272.2 | 6.05E-15 |
| 1100 | 123.9 | 1.31E-06 | 236.4 | 5.95E-12 | 148.4 | 8.98E-08 | 260.8 | 4.13E-13 |
| 1200 | 109.6 | 1.70E-05 | 220.6 | 2.50E-10 | 138.4 | 9.46E-07 | 249.4 | 1.39E-11 |

T in K., $\Delta G$'s in kJ/mol.

TABLE 1

| Temp | $P_{TOT}$(Torr) | % As | % $As_2$ | % $As_3$ | % $As_4$ |
|---|---|---|---|---|---|
| 600 K. | 1 | <0.1 | <0.1 | <0.1 | >99.9 |
| | $10^{-2}$ | <0.1 | <0.1 | <0.1 | >99.9 |
| | $10^{-4}$ | <0.1 | <0.1 | <0.1 | >99.9 |
| | $10^{-6}$ | <0.1 | <0.1 | <0.1 | >99.9 |
| | $10^{-8}$ | <0.1 | 0.1 | <0.1 | 99.9 |
| 800 K. | 1 | <0.1 | <0.1 | <0.1 | >99.9 |
| | $10^{-2}$ | <0.1 | 0.1 | <0.1 | 99.9 |
| | $10^{-4}$ | <0.1 | 0.9 | <0.1 | 99.1 |
| | $10^{-6}$ | <0.1 | 8.6 | <0.1 | 91.4 |
| | $10^{-8}$ | <0.1 | 58.1 | <0.1 | 41.8 |
| 1000 K. | 1 | <0.1 | 0.7 | <0.1 | 99.3 |
| | $10^{-2}$ | <0.1 | 6.4 | 0.1 | 93.5 |
| | $10^{-4}$ | <0.1 | 47.7 | 0.2 | 52.1 |
| | $10^{-6}$ | 0.2 | 97.6 | 0.1 | 2.2 |
| | $10^{-8}$ | 2.1 | 97.9 | <0.1 | <0.1 |
| 1200 K. | 1 | <0.1 | 10.9 | 0.5 | 88.6 |
| | $10^{-2}$ | 0.1 | 66.4 | 0.7 | 32.7 |
| | $10^{-4}$ | 1.0 | 98.2 | 0.1 | 0.7 |
| | $10^{-6}$ | 9.5 | 90.4 | <0.1 | <0.1 |
| | $10^{-8}$ | 61.9 | 38.1 | <0.1 | <0.1 |
| 1400 K. | 1 | 0.1 | 57.2 | 2.3 | 40.5 |
| | $10^{-2}$ | 1.5 | 96.8 | 0.5 | 1.2 |
| | $10^{-4}$ | 14.5 | 85.4 | <0.1 | <0.1 |
| | $10^{-6}$ | 76.4 | 23.6 | <0.1 | <0.1 |
| | $10^{-8}$ | 99.6 | 0.4 | <0.1 | <0.1 |
| 1600 K. | 1 | 1.2 | 91.8 | 2.2 | 4.8 |
| | $10^{-2}$ | 11.6 | 88.1 | 0.2 | <0.1 |
| | $10^{-4}$ | 69.0 | 31.0 | <0.1 | <0.1 |
| | $10^{-6}$ | 99.4 | 0.6 | <0.1 | <0.1 |
| | $10^{-8}$ | >99.9 | <0.1 | <0.1 | <0.1 |
| 1800 K. | 1 | 5.9 | 92.3 | 1.3 | 0.4 |
| | $10^{-2}$ | 45.5 | 54.4 | 0.1 | <0.1 |
| | $10^{-4}$ | 97.5 | 2.5 | <0.1 | <0.1 |
| | $10^{-6}$ | >99.9 | <0.1 | <0.1 | <0.1 |
| | $10^{-8}$ | >99.9 | <0.1 | <0.1 | <0.1 |
| 2000 K. | 1 | 19.9 | 79.4 | 0.6 | <0.1 |
| | $10^{-2}$ | 85.3 | 14.7 | <0.1 | <0.1 |
| | $10^{-4}$ | 99.8 | 0.2 | <0.1 | <0.1 |
| | $10^{-6}$ | 100.0 | <0.1 | <0.1 | <0.1 |
| | $10^{-8}$ | >99.9 | <0.1 | <0.1 | <0.1 |
| | | >99.9 | | | |

TABLE 3

| Temp | $P_{TOT}$(Torr) | % N | % $N_2$ |
|---|---|---|---|
| 1400 K. | 1 | <0.1 | >99.9 |
| | $10^{-2}$ | <0.1 | >99.9 |
| | $10^{-4}$ | <0.1 | >99.9 |
| | $10^{-6}$ | <0.1 | >99.9 |
| | $10^{-8}$ | <0.1 | >99.9 |
| 1600 K. | 1 | <0.1 | >99.9 |
| | $10^{-2}$ | <0.1 | >99.9 |
| | $10^{-4}$ | <0.1 | >99.9 |
| | $10^{-6}$ | <0.1 | >99.9 |
| | $10^{-8}$ | <0.1 | >99.9 |
| 1800 K. | 1 | <0.1 | >99.9 |
| | $10^{-2}$ | <0.1 | >99.9 |
| | $10^{-4}$ | <0.1 | >99.9 |
| | $10^{-6}$ | <0.1 | >99.9 |
| | $10^{-8}$ | <0.1 | >99.9 |
| 2000 K. | 1 | <0.1 | >99.9 |
| | $10^{-2}$ | <0.1 | >99.9 |
| | $10^{-4}$ | <0.1 | >99.9 |
| | $10^{-6}$ | <0.1 | >99.9 |
| | $10^{-8}$ | <0.1 | >99.9 |
| 2200 K. | 1 | <0.1 | >99.9 |
| | $10^{-2}$ | <0.1 | >99.9 |
| | $10^{-4}$ | <0.1 | >99.9 |
| | $10^{-6}$ | <0.1 | >99.9 |
| | $10^{-8}$ | 0.4 | 99.6 |
| 2400 K. | 1 | <0.1 | >99.9 |
| | $10^{-2}$ | <0.1 | >99.9 |
| | $10^{-4}$ | <0.1 | >99.9 |
| | $10^{-6}$ | 0.3 | 99.7 |
| | $10^{-8}$ | 3.2 | 96.8 |

TABLE 4

| Temp | $P_{TOT}$(Torr) | % P | % $P_2$ | % $P_4$ |
|---|---|---|---|---|
| 600 K. | 1 | <0.1 | <0.1 | >99.9 |
| | $10^{-2}$ | <0.1 | <0.1 | >99.9 |
| | $10^{-4}$ | <0.1 | 0.4 | 99.6 |
| | $10^{-6}$ | <0.1 | 3.5 | 96.5 |
| | $10^{-8}$ | <0.1 | 29.7 | 70.3 |

TABLE 4-continued

| Temp | $P_{TOT}$(Torr) | % P | % $P_2$ | % $P_4$ |
|---|---|---|---|---|
| 800 K. | 1 | <0.1 | 1.0 | 99.0 |
| | $10^{-2}$ | <0.1 | 9.2 | 90.8 |
| | $10^{-4}$ | <0.1 | 60.7 | 39.3 |
| | $10^{-6}$ | <0.1 | 99.0 | 1.0 |
| | $10^{-8}$ | <0.1 | >99.9 | <0.1 |
| 1000 K. | 1 | <0.1 | 24.4 | 75.6 |
| | $10^{-2}$ | <0.1 | 89.7 | 10.3 |
| | $10^{-4}$ | <0.1 | 99.9 | 0.1 |
| | $10^{-6}$ | <0.1 | >99.9 | <0.1 |
| | $10^{-8}$ | <0.1 | >99.9 | <0.1 |
| 1200 K. | 1 | <0.1 | 88.7 | 11.3 |
| | $10^{-2}$ | <0.1 | 99.9 | 0.1 |
| | $10^{-4}$ | <0.1 | >99.9 | <0.1 |
| | $10^{-6}$ | 0.1 | 99.9 | <0.1 |
| | $10^{-8}$ | 0.6 | 99.4 | <0.1 |
| 1400 K. | 1 | <0.1 | 99.4 | 0.6 |
| | $10^{-2}$ | <0.1 | >99.9 | <0.1 |
| | $10^{-4}$ | 0.2 | 99.8 | <0.1 |
| | $10^{-6}$ | 1.9 | 98.1 | <0.1 |
| | $10^{-8}$ | 17.4 | 82.6 | <0.1 |
| 1600 K. | 1 | <0.1 | 99.9 | 0.1 |
| | $10^{-2}$ | 0.3 | 99.7 | <0.1 |
| | $10^{-4}$ | 2.7 | 97.3 | <0.1 |
| | $10^{-6}$ | 23.6 | 76.4 | <0.1 |
| | $10^{-8}$ | 89.1 | 10.9 | <0.1 |
| 1800 K. | 1 | 0.2 | 99.8 | <0.1 |
| | $10^{-2}$ | 2.1 | 97.9 | <0.1 |
| | $10^{-4}$ | 19.1 | 80.9 | <0.1 |
| | $10^{-6}$ | 84.2 | 15.8 | <0.1 |
| | $10^{-8}$ | 99.8 | 0.2 | <0.1 |
| 2000 K. | 1 | 1.1 | 98.9 | <0.1 |
| | $10^{-2}$ | 10.4 | 89.6 | <0.1 |
| | $10^{-4}$ | 65.1 | 34.9 | <0.1 |
| | $10^{-6}$ | 99.2 | 0.8 | <0.1 |
| | $10^{-8}$ | >99.9 | <0.1 | <0.1 |
| 2200 K. | 1 | 4.1 | 95.9 | <0.1 |
| | $10^{-2}$ | 34.3 | 65.7 | <0.1 |
| | $10^{-4}$ | 95.0 | 5.0 | <0.1 |
| | $10^{-6}$ | 99.9 | 0.1 | <0.1 |
| | $10^{-8}$ | >99.9 | <0.1 | <0.1 |
| 2400 K. | 1 | 12.2 | 87.8 | <0.1 |
| | $10^{-2}$ | 70.6 | 29.4 | <0.1 |
| | $10^{-4}$ | 99.4 | 0.6 | <0.1 |
| | $10^{-6}$ | >99.9 | <0.1 | <0.1 |
| | $10^{-8}$ | >99.9 | <0.1 | <0.1 |

TABLE 5

| Temp | $P_{TOT}$(Torr) | % Sb | % $Sb_2$ | % $Sb_4$ |
|---|---|---|---|---|
| 600 K. | 1 | <0.1 | <0.1 | >99.9 |
| | $10^{-2}$ | <0.1 | <0.1 | >99.9 |
| | $10^{-4}$ | <0.1 | <0.1 | >99.9 |
| | $10^{-6}$ | <0.1 | 0.3 | 99.7 |
| | $10^{-8}$ | <0.1 | 2.6 | 97.4 |
| 800 K. | 1 | <0.1 | 0.1 | 99.9 |
| | $10^{-2}$ | <0.1 | 1.4 | 98.6 |
| | $10^{-4}$ | <0.1 | 13.3 | 86.7 |
| | $10^{-6}$ | 0.3 | 73.3 | 26.5 |
| | $10^{-8}$ | 3.3 | 96.2 | 0.5 |
| 1000 K. | 1 | <0.1 | 6.0 | 94.0 |
| | $10^{-2}$ | 0.2 | 45.4 | 54.4 |
| | $10^{-4}$ | 3.0 | 94.6 | 2.4 |
| | $10^{-6}$ | 26.7 | 73.3 | <0.1 |
| | $10^{-8}$ | 91.4 | 8.6 | <0.1 |
| 1200 K. | 1 | 0.5 | 52.2 | 47.3 |
| | $10^{-2}$ | 6.1 | 92.4 | 1.5 |
| | $10^{-4}$ | 46.4 | 53.6 | <0.1 |
| | $10^{-6}$ | 97.6 | 2.4 | <0.1 |

TABLE 5-continued

| Temp | $P_{TOT}$(Torr) | % Sb | % $Sb_2$ | % $Sb_4$ |
|---|---|---|---|---|
| | $10^{-8}$ | >99.9 | <0.1 | <0.1 |
| 1400 K. | 1 | 5.2 | 90.8 | 4.0 |
| | $10^{-2}$ | 41.7 | 58.3 | <0.1 |
| | $10^{-4}$ | 96.9 | 3.1 | <0.1 |
| | $10^{-6}$ | >99.9 | <0.1 | <0.1 |
| | $10^{-8}$ | >99.9 | <0.1 | <0.1 |
| 1600 K. | 1 | 24.0 | 75.9 | 0.2 |
| | $10^{-2}$ | 89.4 | 10.6 | <0.1 |
| | $10^{-4}$ | 99.9 | 0.1 | <0.1 |
| | $10^{-6}$ | >99.9 | <0.1 | <0.1 |
| | $10^{-8}$ | >99.9 | <0.1 | <0.1 |
| 1800 K. | 1 | 60.6 | 39.4 | <0.1 |
| | $10^{-2}$ | 99.0 | 1.0 | <0.1 |
| | $10^{-4}$ | >99.9 | <0.1 | <0.1 |
| | $10^{-6}$ | >99.9 | <0.1 | <0.1 |
| | $10^{-8}$ | >99.9 | <0.1 | <0.1 |
| 2000 K. | 1 | 88.7 | 11.3 | <0.1 |
| | $10^{-2}$ | 99.9 | 0.1 | <0.1 |
| | $10^{-4}$ | >99.9 | <0.1 | <0.1 |
| | $10^{-6}$ | >99.9 | <0.1 | <0.1 |
| | $10^{-8}$ | >99.9 | <0.1 | <0.1 |
| 2200 K. | 1 | 97.4 | 2.6 | <0.1 |
| | $10^{-2}$ | >99.9 | <0.1 | <0.1 |
| | $10^{-4}$ | >99.9 | <0.1 | <0.1 |
| | $10^{-6}$ | >99.9 | <0.1 | <0.1 |
| | $10^{-8}$ | >99.9 | <0.1 | <0.1 |

TABLE 6

| Temp | $P_{TOT}$(Torr) | % Bi | % $Bi_2$ |
|---|---|---|---|
| 600 K. | 1 | <0.1 | >99.9 |
| | $10^{-2}$ | <0.1 | >99.9 |
| | $10^{-4}$ | 0.3 | 99.7 |
| | $10^{-6}$ | 2.6 | 97.4 |
| | $10^{-8}$ | 22.8 | 77.2 |
| 800 K. | 1 | 0.4 | 99.6 |
| | $10^{-2}$ | 4.0 | 96.0 |
| | $10^{-4}$ | 33.4 | 66.6 |
| | $10^{-6}$ | 94.6 | 5.4 |
| | $10^{-8}$ | 99.9 | 0.1 |
| 1000 K. | 1 | 8.2 | 91.8 |
| | $10^{-2}$ | 56.3 | 43.7 |
| | $10^{-4}$ | 98.7 | 1.3 |
| | $10^{-6}$ | >99.9 | <0.1 |
| | $10^{-8}$ | >99.9 | <0.1 |
| 1200 K. | 1 | 46.9 | 53.1 |
| | $10^{-2}$ | 97.7 | 2.3 |
| | $10^{-4}$ | >99.9 | <0.1 |
| | $10^{-6}$ | >99.9 | <0.1 |
| | $10^{-8}$ | >99.9 | <0.1 |
| 1400 K. | 1 | 89.3 | 10.7 |
| | $10^{-2}$ | 99.9 | 0.1 |
| | $10^{-4}$ | >99.9 | <0.1 |
| | $10^{-6}$ | >99.9 | <0.1 |
| | $10^{-8}$ | >99.9 | <0.1 |
| 1600 K. | 1 | 98.5 | 1.5 |
| | $10^{-2}$ | >99.9 | <0.1 |
| | $10^{-4}$ | >99.9 | <0.1 |
| | $10^{-6}$ | >99.9 | <0.1 |
| | $10^{-8}$ | >99.9 | <0.1 |
| 1800 K. | 1 | 99.7 | 0.3 |
| | $10^{-2}$ | >99.9 | <0.1 |
| | $10^{-4}$ | >99.9 | <0.1 |
| | $10^{-6}$ | >99.9 | <0.1 |
| | $10^{-8}$ | >99.9 | <0.1 |

TABLE 7

| Temp | $P_{TOT}$(Torr) | % S | % $S_2$ | % $S_3$ | % $S_4$ | % $S_5$ | % $S_6$ | % $S_7$ | % $S_8$ |
|---|---|---|---|---|---|---|---|---|---|
| 600 K. | 1 | <0.1 | 16.7 | 1.2 | 0.6 | 4.3 | 36.1 | 14.9 | 26.2 |
|  | $10^{-2}$ | <0.1 | 96.9 | 1.7 | 0.2 | 0.4 | 0.7 | 0.1 | <0.1 |
|  | $10^{-4}$ | <0.1 | 99.8 | 0.2 | <0.1 | <0.1 | <0.1 | <0.1 | <0.1 |
|  | $10^{-6}$ | <0.1 | >99.9 | <0.1 | <0.1 | <0.1 | <0.1 | <0.1 | <0.1 |
|  | $10^{-8}$ | <0.1 | >99.9 | <0.1 | <0.1 | <0.1 | <0.1 | <0.1 | <0.1 |
| 800 K. | 1 | <0.1 | 98.4 | 1.5 | 0.1 | <0.1 | <0.1 | <0.1 | <0.1 |
|  | $10^{-2}$ | <0.1 | 99.8 | 0.1 | <0.1 | <0.1 | <0.1 | <0.1 | <0.1 |
|  | $10^{-4}$ | <0.1 | >99.9 | <0.1 | <0.1 | <0.1 | <0.1 | <0.1 | <0.1 |
|  | $10^{-6}$ | <0.1 | >99.9 | <0.1 | <0.1 | <0.1 | <0.1 | <0.1 | <0.1 |
|  | $10^{-8}$ | <0.1 | >99.9 | <0.1 | <0.1 | <0.1 | <0.1 | <0.1 | <0.1 |
| 1000 K. | 1 | <0.1 | 99.7 | 0.3 | <0.1 | <0.1 | <0.1 | <0.1 | <0.1 |
|  | $10^{-2}$ | <0.1 | >99.9 | <0.1 | <0.1 | <0.1 | <0.1 | <0.1 | <0.1 |
|  | $10^{-4}$ | <0.1 | >99.9 | <0.1 | <0.1 | <0.1 | <0.1 | <0.1 | <0.1 |
|  | $10^{-6}$ | <0.1 | >99.9 | <0.1 | <0.1 | <0.1 | <0.1 | <0.1 | <0.1 |
|  | $10^{-8}$ | 0.2 | 99.8 | <0.1 | <0.1 | <0.1 | <0.1 | <0.1 | <0.1 |
| 1200 K. | 1 | <0.1 | 99.9 | 0.1 | <0.1 | <0.1 | <0.1 | <0.1 | <0.1 |
|  | $10^{-2}$ | <0.1 | >99.9 | <0.1 | <0.1 | <0.1 | <0.1 | <0.1 | <0.1 |
|  | $10^{-4}$ | 0.1 | 99.8 | <0.1 | <0.1 | <0.1 | <0.1 | <0.1 | <0.1 |
|  | $10^{-6}$ | 1.5 | 98.5 | <0.1 | <0.1 | <0.1 | <0.1 | <0.1 | <0.1 |
|  | $10^{-8}$ | 13.8 | 86.2 | <0.1 | <0.1 | <0.1 | <0.1 | <0.1 | <0.1 |
| 1400 K. | 1 | <0.1 | 99.9 | 0.1 | <0.1 | <0.1 | <0.1 | <0.1 | <0.1 |
|  | $10^{-2}$ | 0.3 | 99.7 | <0.1 | <0.1 | <0.1 | <0.1 | <0.1 | <0.1 |
|  | $10^{-4}$ | 3.2 | 96.8 | <0.1 | <0.1 | <0.1 | <0.1 | <0.1 | <0.1 |
|  | $10^{-6}$ | 27.7 | 72.3 | <0.1 | <0.1 | <0.1 | <0.1 | <0.1 | <0.1 |
|  | $10^{-8}$ | 92.0 | 8.0 | <0.1 | <0.1 | <0.1 | <0.1 | <0.1 | <0.1 |
| 1600 K. | 1 | 0.3 | 99.6 | <0.1 | <0.1 | <0.1 | <0.1 | <0.1 | <0.1 |
|  | $10^{-2}$ | 3.2 | 96.8 | <0.1 | <0.1 | <0.1 | <0.1 | <0.1 | <0.1 |
|  | $10^{-4}$ | 27.9 | 72.0 | <0.1 | <0.1 | <0.1 | <0.1 | <0.1 | <0.1 |
|  | $10^{-6}$ | 92.2 | 7.8 | <0.1 | <0.1 | <0.1 | <0.1 | <0.1 | <0.1 |
|  | $10^{-8}$ | 99.9 | 0.1 | <0.1 | <0.1 | <0.1 | <0.1 | <0.1 | <0.1 |
| 1800 K. | 1 | 2.0 | 98.0 | <0.1 | <0.1 | <0.1 | <0.1 | <0.1 | <0.1 |
|  | $10^{-2}$ | 18.0 | 82.0 | <0.1 | <0.1 | <0.1 | <0.1 | <0.1 | <0.1 |
|  | $10^{-4}$ | 82.7 | 17.3 | <0.1 | <0.1 | <0.1 | <0.1 | <0.1 | <0.1 |
|  | $10^{-6}$ | 99.7 | 0.3 | <0.1 | <0.1 | <0.1 | <0.1 | <0.1 | <0.1 |
|  | $10^{-8}$ | >99.9 | <0.1 | <0.1 | <0.1 | <0.1 | <0.1 | <0.1 | <0.1 |
| 2000 K. | 1 | 8.1 | 91.9 | <0.1 | <0.1 | <0.1 | <0.1 | <0.1 | <0.1 |
|  | $10^{-2}$ | 55.8 | 44.2 | <0.1 | <0.1 | <0.1 | <0.1 | <0.1 | <0.1 |
|  | $10^{-4}$ | 98.6 | 1.4 | <0.1 | <0.1 | <0.1 | <0.1 | <0.1 | <0.1 |
|  | $10^{-6}$ | >99.9 | <0.1 | <0.1 | <0.1 | <0.1 | <0.1 | <0.1 | <0.1 |
| 2200 K. | 1 | 23.8 | 76.2 | <0.1 | <0.1 | <0.1 | <0.1 | <0.1 | <0.1 |
|  | $10^{-2}$ | 89.3 | 10.7 | <0.1 | <0.1 | <0.1 | <0.1 | <0.1 | <0.1 |
|  | $10^{-4}$ | 99.9 | 0.1 | <0.1 | <0.1 | <0.1 | <0.1 | <0.1 | <0.1 |

TABLE 8

| Temp | $P_{TOT}$(Torr) | % Se | % $Se_2$ | % $Se_3$ | % $Se_4$ | % $Se_5$ | % $Se_6$ | % $Se_7$ | % $Se_8$ |
|---|---|---|---|---|---|---|---|---|---|
| 600 K. | 1 | <0.1 | 8.0 | 0.1 | 0.2 | 17.5 | 46.6 | 24.0 | 3.6 |
|  | $10^{-2}$ | <0.1 | 86.0 | 0.3 | 0.3 | 6.6 | 5.8 | 1.0 | <0.1 |
|  | $10^{-4}$ | <0.1 | >99.9 | <0.1 | <0.1 | <0.1 | <0.1 | <0.1 | <0.1 |
|  | $10^{-6}$ | <0.1 | >99.9 | <0.1 | <0.1 | <0.1 | <0.1 | <0.1 | <0.1 |
|  | $10^{-8}$ | <0.1 | >99.9 | <0.1 | <0.1 | <0.1 | <0.1 | <0.1 | <0.1 |
| 800 K. | 1 | <0.1 | 98.7 | 0.6 | 0.3 | 0.3 | 0.1 | <0.1 | <0.1 |
|  | $10^{-2}$ | <0.1 | 99.9 | 0.1 | <0.1 | <0.1 | <0.1 | <0.1 | <0.1 |
|  | $10^{-4}$ | <0.1 | >99.9 | <0.1 | <0.1 | <0.1 | <0.1 | <0.1 | <0.1 |
|  | $10^{-6}$ | <0.1 | >99.9 | <0.1 | <0.1 | <0.1 | <0.1 | <0.1 | <0.1 |
|  | $10^{-8}$ | 0.3 | 99.7 | <0.1 | <0.1 | <0.1 | <0.1 | <0.1 | <0.1 |
| 1000 K. | 1 | <0.1 | 99.7 | 0.2 | <0.1 | <0.1 | <0.1 | <0.1 | <0.1 |
|  | $10^{-2}$ | <0.1 | >99.9 | <0.1 | <0.1 | <0.1 | <0.1 | <0.1 | <0.1 |
|  | $10^{-4}$ | 0.4 | 99.5 | <0.1 | <0.1 | <0.1 | <0.1 | <0.1 | <0.1 |
|  | $10^{-6}$ | 4.4 | 95.6 | <0.1 | <0.1 | <0.1 | <0.1 | <0.1 | <0.1 |
|  | $10^{-8}$ | 36.0 | 64.0 | <0.1 | <0.1 | <0.1 | <0.1 | <0.1 | <0.1 |
| 1200 K. | 1 | 0.1 | 99.7 | 0.1 | <0.1 | <0.1 | <0.1 | <0.1 | <0.1 |
|  | $10^{-2}$ | 1.3 | 98.7 | <0.1 | <0.1 | <0.1 | <0.1 | <0.1 | <0.1 |
|  | $10^{-4}$ | 12.0 | 88.0 | <0.1 | <0.1 | <0.1 | <0.1 | <0.1 | <0.1 |
|  | $10^{-6}$ | 70.1 | 29.9 | <0.1 | <0.1 | <0.1 | <0.1 | <0.1 | <0.1 |
|  | $10^{-8}$ | 99.4 | 0.6 | <0.1 | <0.1 | <0.1 | <0.1 | <0.1 | <0.1 |
| 1400 K. | 1 | 1.4 | 98.5 | 0.1 | <0.1 | <0.1 | <0.1 | <0.1 | <0.1 |
|  | $10^{-2}$ | 13.1 | 86.9 | <0.1 | <0.1 | <0.1 | <0.1 | <0.1 | <0.1 |
|  | $10^{-4}$ | 73.0 | 27.0 | <0.1 | <0.1 | <0.1 | <0.1 | <0.1 | <0.1 |
|  | $10^{-6}$ | 99.5 | 0.5 | <0.1 | <0.1 | <0.1 | <0.1 | <0.1 | <0.1 |
|  | $10^{-8}$ | >99.9 | <0.1 | <0.1 | <0.1 | <0.1 | <0.1 | <0.1 | <0.1 |
| 1600 K. | 1 | 8.1 | 91.9 | <0.1 | <0.1 | <0.1 | <0.1 | <0.1 | <0.1 |
|  | $10^{-2}$ | 56.0 | 44.0 | <0.1 | <0.1 | <0.1 | <0.1 | <0.1 | <0.1 |
|  | $10^{-4}$ | 98.6 | 1.4 | <0.1 | <0.1 | <0.1 | <0.1 | <0.1 | <0.1 |

TABLE 8-continued

| Temp | $P_{TOT}$(Torr) | % Se | % Se$_2$ | % Se$_3$ | % Se$_4$ | % Se$_5$ | % Se$_6$ | % Se$_7$ | % Se$_8$ |
|---|---|---|---|---|---|---|---|---|---|
| | $10^{-6}$ | >99.9 | <0.1 | <0.1 | <0.1 | <0.1 | <0.1 | <0.1 | <0.1 |
| 1800 K. | 1 | 28.8 | 71.2 | <0.1 | <0.1 | <0.1 | <0.1 | <0.1 | <0.1 |
| | $10^{-2}$ | 92.6 | 7.4 | <0.1 | <0.1 | <0.1 | <0.1 | <0.1 | <0.1 |
| | $10^{-4}$ | 99.9 | 0.1 | <0.1 | <0.1 | <0.1 | <0.1 | <0.1 | <0.1 |
| 2000 K. | 1 | 63.2 | 36.8 | <0.1 | <0.1 | <0.1 | <0.1 | <0.1 | <0.1 |
| | $10^{-2}$ | 99.1 | 0.9 | <0.1 | <0.1 | <0.1 | <0.1 | <0.1 | <0.1 |
| | $10^{-4}$ | >99.9 | <0.1 | <0.1 | <0.1 | <0.1 | <0.1 | <0.1 | <0.1 |

TABLE 9

| Temp | $P_{TOT}$(Torr) | % Te | % Te$_2$ |
|---|---|---|---|
| 600 K. | 1 | <0.1 | >99.9 |
| | $10^{-2}$ | <0.1 | >99.9 |
| | $10^{-4}$ | <0.1 | >99.9 |
| | $10^{-6}$ | <0.1 | >99.9 |
| | $10^{-8}$ | 0.1 | 99.9 |
| 800 K. | 1 | <0.1 | >99.9 |
| | $10^{-2}$ | <0.1 | >99.9 |
| | $10^{-4}$ | 0.5 | 99.5 |
| | $10^{-6}$ | 4.6 | 95.4 |
| | $10^{-8}$ | 37.5 | 62.5 |
| 1000 K. | 1 | 0.3 | 99.7 |
| | $10^{-2}$ | 2.5 | 97.5 |
| | $10^{-4}$ | 22.4 | 77.6 |
| | $10^{-6}$ | 88.0 | 12.0 |
| | $10^{-8}$ | 99.8 | 0.2 |
| 1200 K. | 1 | 3.5 | 96.5 |
| | $10^{-2}$ | 30.1 | 69.9 |
| | $10^{-4}$ | 93.3 | 6.7 |
| | $10^{-6}$ | 99.9 | 0.1 |
| | $10^{-8}$ | >99.9 | <0.1 |
| 1400 K. | 1 | 21.3 | 78.7 |
| | $10^{-2}$ | 86.9 | 13.1 |
| | $10^{-4}$ | 99.8 | 0.2 |
| | $10^{-6}$ | >99.9 | <0.1 |
| | $10^{-8}$ | >99.9 | <0.1 |
| 1600 K. | 1 | 61.6 | 38.4 |
| | $10^{-2}$ | 99.0 | 1.0 |
| | $10^{-4}$ | >99.9 | <0.1 |
| | $10^{-6}$ | >99.9 | <0.1 |
| | $10^{-8}$ | >99.9 | <0.1 |

We claim:

1. A Group V or VI atom source comprising:
a molecular beam source for forming a molecular beam from a solid element, said molecular beam source comprising a sublimator for heating said solid element to a temperature sufficient to sublime said element as polymeric molecules;
an atomizer for receiving said molecular beam and for outputting atoms of said element, said atomizer for operating at an atomizer temperature sufficiently high and an atomizer pressure sufficiently low to convert a portion of said molecular beam into said atoms; and
a means for providing a pressure differential between said molecular beam source and said atomizer.

2. The atom source of claim 1 wherein said portion is greater than 5%.

3. The atom source of claim 2 wherein said portion is greater than 10%.

4. The atom source of claim 3 wherein said portion is greater than 50%.

5. The atom source of claim 1 wherein said element is selected from the group consisting of P, As, Sb, S, Se and Te.

6. The atom source of claim 5 wherein said element is P and said atomizer temperature is above about 1800K and said atomizer pressure is below about $10^{-3}$ torr.

7. The atom source of claim 6 wherein atomizer temperature is above about 2000K.

8. The atom source of claim 6 wherein said atomizer pressure is below about $10^{-5}$ torr.

9. The atom source of claim 5 wherein said element is As and said atomizer temperature is above about 1200K and said atomizer pressure is below about $10^{-2}$ torr.

10. The atom source of claim 9 wherein atomizer temperature is above about 1400K.

11. The atom source of claim 10 wherein said atomizer temperature is above about 1600K.

12. The atom source of claim 9 wherein said atomizer pressure is below about $10^3$ torr.

13. The atom source of claim 12 wherein said atomizer pressure is below about $10^{-4}$ torr.

14. The atom source of claim 12 wherein said atomizer temperature is below about 1800K.

15. The atom source of claim 5 wherein said element is Sb and said atomizer temperature is above about 1200K and said atomizer pressure is below about $10^{-2}$ torr.

16. The atom source of claim 15 wherein atomizer temperature is above about 1400K.

17. The atom source of claim 15 wherein said atomizer pressure is below about $10^{-4}$ torr.

18. The atom source of claim 5 wherein said element is S and said atomizer temperature is above about 1700K and said atomizer pressure is below about $10^{-2}$ torr.

19. The atom source of claim 18 wherein atomizer temperature is above about 2000K.

20. The atom source of claim 18 wherein said atomizer pressure is below about $10^{-4}$ torr.

21. The atom source of claim 5 wherein said element is Se and said atomizer temperature is above about 1300K and said atomizer pressure is below about $10^{-2}$ torr.

22. The atom source of claim 21 wherein atomizer temperature is above about 1600K.

23. The atom source of claim 21 wherein said atomizer pressure is below about $10^{-4}$ torr.

24. The atom source of claim 5 wherein said element is Te and said atomizer temperature is above about 1100K and said atomizer pressure is below about $10^{-2}$ torr.

25. The atom source of claim 24 wherein atomizer temperature is above about 1300K.

26. The atom source of claim 24 wherein said atomizer pressure is below about $10^{-4}$ torr.

27. The atom source of claim 1 wherein said atomizer is made of a material selected from the group consisting of tungsten, lanthanum, niobium, rhenium, molybdenum, tantalum, stainless steel, nickel, carbon, platinum, boron, silicon, ceramic and boron nitride.

28. The atom source of claim 27 wherein said atomizer is made of a material selected from the group consisting of tantalum, molybdenum, rhenium, niobium and tungsten.

29. The atom source of claim 27 wherein said atomizer is made of a material selected from the group consisting of tantalum, molybdenum and silicon.

30. The atom source of claim 1 wherein said atomizer is a flat plate.

31. The atom source of claim 1 wherein said atomizer is a curved plate.

32. The atom source of claim 1 wherein said atomizer comprises a plurality of plates.

33. The atom source of claim 1 wherein said atomizer is a cylindrical plate.

34. The atom source of claim 33 wherein said cylindrical plate has a hole or slit therein to increase the conductance of said plate.

35. The atom source of claim 1 wherein said molecular beam source further comprises a cracker for receiving said polymerized molecules from said sublimator and for heating said polymerized molecules to a temperature sufficient to break a portion of said polymerized molecules into smaller polymerized molecules.

36. The atom source of claim 35 wherein said element is selected from the group consisting of P, As, Sb, S and Se, and wherein said smaller polymerized molecules are dimers.

37. The atom source of claim 1 wherein said means for providing a pressure differential comprises a beam flux limiter positioned between said molecular beam source and said atomizer.

38. The atom source of claim 1 wherein said means for providing a pressure differential comprises a beam flux limiter positioned between said sublimator and said atomizer.

39. The atom source of claim 1 wherein said means for providing a pressure differential comprises means for increasing the conductance at said atomizer.

40. An arsenic atom source comprising:
a molecular beam source for forming a molecular beam, characterized by a beam equivalent pressure, from solid arsenic, said molecular beam source comprising a sublimator for heating said solid arsenic to a temperature above about 500K;
a surface positioned to receive said molecular beam, said surface for operating at a surface temperature above about 1200K and a beam equivalent pressure below about $10^{-3}$ torr or at a surface temperature above about 1400K and a beam equivalent pressure below about $10^{-2}$ torr; and
a means for providing a pressure differential between said molecular beam source and said surface.

41. The arsenic atom source of claim 40 wherein said surface temperature is above about 1200K and said pressure is below about $10^{-3}$ torr.

42. The arsenic atom source of claim 41 wherein said surface temperature is below about 1800K.

43. The arsenic atom source of claim 41 wherein said pressure is below about $10^{-4}$ torr.

44. The arsenic atom source of claim 40 wherein said surface temperature is above about 1400K and said pressure is below about $10^{-2}$ torr.

45. The arsenic atom source of claim 44 wherein said surface temperature is above about 1600K.

46. The arsenic atom source of claim 40 wherein said surface is made of a material selected from the group consisting of tungsten, lanthanum, niobium, rhenium, molybdenum, tantalum, stainless steel, nickel, carbon, platinum, boron, silicon, ceramic and boron nitride.

47. The arsenic atom source of claim 46 wherein said surface is made of a material selected from the group consisting of tantalum, molybdenum, rhenium, niobium and tungsten.

48. The arsenic atom source of claim 46 wherein said surface is made of a material selected from the group consisting of tantalum, molybdenum and silicon.

49. The arsenic atom source of claim 40 wherein said molecular beam source further comprises a cracker, positioned to receive arsenic molecules from said sublimator, said cracker for heating said arsenic molecules to a temperature above about 800K.

50. The arsenic atom source of claim 40 wherein said means for providing a pressure differential comprises a beam flux limiter positioned between said molecular beam source and said surface.

51. The arsenic atom source of claim 40 wherein said means for providing a pressure differential comprises a beam flux limiter positioned between said sublimator and said surface.

52. The arsenic atom source of claim 40 wherein said means for providing a pressure differential comprises means for increasing the conductance at said surface.

53. A method of preparing gaseous arsenic atoms, said method comprising the steps of:
providing the arsenic atom source of claim 40;
forming an arsenic molecular beam by heating solid arsenic to above about 500K in said sublimator; and
impinging said molecular beam on said surface.

* * * * *